United States Patent
Davis et al.

(10) Patent No.: US 9,182,434 B2
(45) Date of Patent: Nov. 10, 2015

(54) FAST SAR ASSESSMENT AND CERTIFICATION SYSTEM FOR WIRELESS DEVICE CERTIFICATION

(75) Inventors: Christoper C. Davis, Bowie, MD (US); Quirino Balzano, Annapolis, MD (US); Vildana Hodzic, College Park, MD (US); Robert W. Gammon, University Park, MD (US)

(73) Assignee: UNIVERSITY OF MARYLAND - OFFICE OF TECHNOLOGY, College Park, MD (US)

( * ) Notice: Subject to any disclaimer, the term of this patent is extended or adjusted under 35 U.S.C. 154(b) by 638 days.

(21) Appl. No.: 12/997,555

(22) PCT Filed: Jun. 10, 2009

(86) PCT No.: PCT/US2009/046959
§ 371 (c)(1),
(2), (4) Date: Apr. 28, 2011

(87) PCT Pub. No.: WO2009/152277
PCT Pub. Date: Dec. 17, 2009

(65) Prior Publication Data
US 2011/0205544 A1    Aug. 25, 2011

Related U.S. Application Data

(60) Provisional application No. 61/060,307, filed on Jun. 10, 2008.

(51) Int. Cl.
*G01B 9/02* (2006.01)
*G01R 29/08* (2006.01)

(52) U.S. Cl.
CPC ........ *G01R 29/0885* (2013.01); *G01R 29/0857* (2013.01)

(58) Field of Classification Search
CPC ................. G01R 29/0857; G01R 29/0885
USPC .......... 356/450, 517, 432, 436, 440, 128
See application file for complete search history.

(56) References Cited

U.S. PATENT DOCUMENTS 4,452,071 A * 6/1984 Eesley et al. ............ 73/52
4,823,811 A * 4/1989 Harrison ............... 607/101

(Continued)

OTHER PUBLICATIONS

Seuntjens et al. "Correction factors for a cylindrical ionization chamber used in medium-energy x-ray beams" Phys. Med. Biol. 38 (1993) 805-832.*

(Continued)

*Primary Examiner* — Michael A Lyons
*Assistant Examiner* — Shawn Decenzo
(74) *Attorney, Agent, or Firm* — Arent Fox LLP

(57) ABSTRACT

A new rapid optical specific absorption rate (SAR) system is disclosed. The rapid optical SAR system has ability to measure and map the power deposited in a flat phantom or other phantom filled with a transparent simulant fluid. Absolute rates of temperature increase in the phantom by photo thermal techniques are measured. For example, the temperature increase and gradients in the phantom bend the path of a laser beam, which may be aimed at a position sensitive detector. The spatial SAR may be mapped and SAR differences between different telephones and telephone orientations, for example, can be distinguished. The system is non-invasive and non-perturbing of the SAR distribution in the phantom, can measure at locations up to the interior surface of the phantom, and provides thermally-based SAR measurements that do not necessarily require constant calibration.

31 Claims, 17 Drawing Sheets

(56) References Cited

U.S. PATENT DOCUMENTS

| | | | | |
|---|---|---|---|---|
| 4,842,408 | A | * | 6/1989 | Yoshii et al. ............... 356/489 |
| 5,746,829 | A | * | 5/1998 | Matsunaga et al. ........... 117/203 |
| 5,750,986 | A | * | 5/1998 | Genovese .................... 250/235 |
| 6,190,915 | B1 | * | 2/2001 | Madsen et al. .................. 436/8 |
| 6,798,168 | B1 | * | 9/2004 | Annamalai et al. ........... 320/112 |
| 7,683,632 | B2 | * | 3/2010 | Kiminami et al. ............ 324/632 |
| 2006/0114003 | A1 | * | 6/2006 | Onishi et al. ................. 324/632 |
| 2010/0180702 | A1 | * | 7/2010 | Koyamashita et al. ...... 73/866.4 |
| 2012/0002193 | A1 | * | 1/2012 | Elliott et al. ................. 356/121 |

OTHER PUBLICATIONS

Hodzic et al. Fast Start Compliance assessment using optical techniques. the bioelectromagnetics society 29th annual meeting abstract collection. Jun. 2007. pp. 192-195.*

Hamada et al. Comparison of free space calibration techniques of a SAR-probe. the bioelectromagnetics society 29th annual meeting abstract collection. Jun. 2007. pp. 414-416.*

OKeefe et al. Cabity ring-down optical spectrometer for absoprtion measurements using pulsed laser sources. review of scientific instruments. 1988, pp. 1-11.*

Davis et al. Final report on the international intercomparison of SAR measurements on cellular telephones. THe bioelectromagnetics society $29^{th}$ annual meeting abstract collection. Jun. 2007. pp. 198-200.*

Capstick et al. Radio frequency radiation reverberation chamber exposure system for rodents. The bioelectromagnetics society $29^{th}$ annual meeting abstract collection. Jun. 2007. pp. 222-225.*

* cited by examiner

FAST SAR ASSESSMENT AND CERTIFICATION SYSTEM FOR WIRELESS DEVICE CERTIFICATION

This application claims priority to Applicant's U.S. Provisional Patent Appl. No. 61/060,307 titled "RAPID SAR ASESSMENT SYSTEM" filed Jun. 10, 2008, the entirety of which is incorporated herein by reference.

BACKGROUND OF THE INVENTION

1. Field of the Invention

Aspects of the present invention relate to devices and systems for measuring the specific absorption rate (SAR) for wireless and other electromagnetic radiation emitting devices. Aspects of the present invention also relate to techniques for measuring SAR or thermal effects generally. One aspect of the present invention relates to an optical technique for measuring SAR for wireless and other electromagnetic radiation emitting devices.

2. Background of the Related Art

The Federal Communications Commission (FCC) sets guidelines for the acceptable levels of electromagnetic radiation emitted by various wireless devices used in close proximity to the human body. Similar standards are applied globally. Devices subject to these standards currently include cellular and mobile telephones, and have the potential to further encompass medical devices as wireless technology expands into this field. Because the FCC requirements and other standards dictate which wireless communication device models can be legally sold, compliance is of paramount importance to both manufacturers and retailers. Yet, the emission profile or SAR profile of a particular device can depend in unexpected and effectively unpredictable ways on parameters that are readily changed from model generation to generation (e.g., the shape of the device, shape of the antenna, exposure of various device components). Predicting resulting SAR profiles from design changes is not easily and accurately achieved computationally. Therefore, an accurate, easily implemented and cost effective measurement technique is essential.

Systems and procedures for testing and evaluating wireless devices, such as cellular telephones, in terms of near-field exposure are known. Most, however, are rather cumbersome, expensive and exhibit considerable limitations, including limitations relating to flexibility, reproducibility and speed and ease of use. Many current devices and methods rely on the physical scanning and mechanical translation of a small electromagnetic field probe through a medium-filled trough, known as a phantom, often having an anthropomorphic shape. See, for example U.S. Pat. No. 7,268,564, the entirety of which is hereby incorporated by reference.

While such devices can effectively provide test results, the robotics and other mechanical translation systems can be expensive and difficult to maintain. Robotics systems and the means to control them with accuracy are inherently expensive. The mechanical probe system described above is also difficult to calibrate and standardize. Testing results on the same subjects have been shown to vary widely in different laboratories and conditions (See "The International Intercomparison of SAR Measurements on Cellular telephones," Christopher C. Davis, Quirino Balzano, IEEE Transactions on Electromagnetic Compatibility 51, 210-216, 2009, attached as an Appendix and the entirety of which is herby incorporated by reference). Moreover, techniques relying on the mechanical translation of a probe can be relatively slow and not easily applied to large numbers of test samples. In each SAR measurement, probes must be painstakingly rastered throughout a three dimensional, irradiated volume of the phantom liquid, in a way that does not disturb that liquid substantially enough to affect the measurement. This limitation provides an upper bound on the speed with which the technique can ascertain the SAR of a particular device in a specific test media. In fact, a full assessment for a single wireless device can take a skilled operator a day or more to complete.

Further, the necessity of having a fluid-filled phantom that has at least one side open to the air to accommodate the probe and robotic arm creates restraints on the technique's applicability. For example, only tissue-simulating liquid that does not evaporate may be used. Such tissue-simulating liquid almost necessarily includes expensive evaporation-resistive chemical additives that can make dealing with the fluid difficult, cumbersome and, in some cases, hazardous. For example, one commonly used additive to prevent evaporation is Diethylene glycol butyl ether (DGBE), which has been shown to cause birth defects in animals, as well as corneal injuries upon exposure to the eyes. Readily available, cheaper and more benign alternatives for the phantom fluid are necessarily excluded from use in mechanical probe systems with exposed phantom fluid because of the evaporation problem. For example, mixtures of salt water and alcohol can mimic the dielectric properties of the human body at many desired testing frequencies. However, these mixtures cannot be used with open phantoms because the alcohol readily causes them to evaporate. In addition, the nature of the mechanical probe apparatus precludes the use of solid or gelled phantom media.

Current methods involving robotic probes also have physical limitations that can prevent them from being useful for higher frequency tests. Generally speaking, higher frequency signals in the radio frequency range emitted by wireless devices do not penetrate as far into the body (or phantom medium) as lower frequency signals. Then, as wireless devices emit higher and higher frequency radiation, testing will require accurate measurements in smaller and smaller volumes of phantom liquid. This constraint will further require measurements to be made very close to the surface of the phantom. Typical mechanical probes operated by robotics are often too bulky, and their movements too coarse, to provide accurate data in these situations. Even if a suitable robotics operated mechanical probe were to become available, it would likely be prohibitively expensive.

In addition, techniques described above indirectly measure the SAR by measuring the variation of electric fields within the phantom. The energy released into the material of the phantom then needs to be deduced, indirectly, from this electric field measurement. A more direct measurement would be to assess the actual energy released in the phantom via an increase in temperature. From such a measurement, the local energy deposition could be directly calculated, as long as the specific heat of the media in the phantom was known.

Thus, there is a need in the art for a fast SAR assessment apparatus that avoids the use of mechanical and robotic probes and, instead, relies on a less cumbersome, less expensive and more readily available equipment to produce results more quickly. There is also a need in the art for a fast SAR assessment apparatus that allows the use of phantoms that can be completely or nearly completely sealed and, therefore, can accommodate less toxic and more easily handled phantom media. Further, there is a need in the art for a fast SAR assessment apparatus that is adaptable without serious modification to SAR assessment of devices emitting high frequency RF radiation.

SUMMARY OF THE INVENTION

Aspects of the present invention relate to methods, features, and operations pertaining to a Rapid Optical SAR System for, among other things, wireless device testing and certification. However, it should be noted that aspects of the present invention are not limited in application to SAR testing or to the testing of wireless devices. Aspects of the present invention can be used to measure electromagnetic radiation and/or resulting temperature fluctuations in any suitable system for any suitable application. Aspects of the present invention can also be used to measure temperature fluctuations more generally.

While discussion of the aspects of the present invention that follows uses SAR assessment of wireless communication devices as an exemplary application, it should be appreciated that the implementation of variations of the present invention is not limited to SAR assessment and may be used for a variety of other purposes. For example, aspects of the present invention may be used to measure and map the heat or electromagnetic signatures of various devices both related and unrelated to wireless communication.

Further, although the basic layout of the measurement and related apparatus here are discussed in detail without extensive discussion of the user interface, it is to be understood that adding suitable components related to a user interface are within the scope hereof. For example, variations of the invention discussed herein can be substantially automated and supplied with a suitable graphical user interface for commercialization. Although most of the discussion that follows uses a flat phantom as an example, it is to be understood that variations of the invention encompass all other suitable types of phantom, as well, including anthropomorphic phantoms that resemble aspects of the human body (see, e.g., the phantom used in U.S. Pat. No. 7,268,564). Although the discussion primarily focuses on the use of liquid-filled phantoms, it is to be understood that phantoms using gelled or solid materials may also be used within the scope hereof. Further, many different types of phantoms may be used in a modular phantom setup that may also include a phantom holder or carriage allowing phantoms to be exchanged with relative ease. The carriage or holder may itself be automated such that the exchange of phantoms is automated.

Aspects of the present invention relate to a system that can measure absolute rates of temperature increase using photo-thermal techniques. Variations of the present invention relate to measuring temperature increase and gradients in a phantom through a phase shift or a bend of the path of a laser beam aimed at a Position Sensitive Detector (PSD). Aspects of the present invention relate to mapping the spatial SAR, measuring the absolute rates of temperature increase in the phantom in order to assess SAR profile differences between different telephones, and for the same telephone used in different orientations, modes or under different operating conditions.

In one aspect of the present invention, a rapid SAR measurement system includes: at least one laser, at least one mirror positioned to reflect light emitted by the at least one laser in a light path, at least one phantom positioned such that the light path is within a portion of the phantom, a holder for holding an electromagnetic radiation emitting device, such that it emits electromagnetic radiation into the portion of the phantom, and a collector coupled to an analyzer for collecting and analyzing light from the light path. In one of the variations of this aspect of the invention, the collector includes an aperture and the analyzer includes a PIN photodiode that are capable of collecting and analyzing an interference pattern. In another of the variations of this aspect of the invention, the collector includes at least one PSD that is capable of detecting a deflection of light from the at least one laser.

In another aspect of the present invention, a rapid SAR measurement system includes: a first and second laser placed orthogonally from each other, each of the first and second lasers emitting light in a light path, at least one phantom positioned such that the light paths of the first and second lasers is within a portion of the phantom; a holder for holding an electromagnetic radiation emitting device, such that it emits electromagnetic radiation into the portion of the phantom, and a collector, including at least one PSD that is capable of detecting a deflection of light along the light paths of the first and second lasers.

In yet another aspect of the present invention, a method using a rapid SAR measurement system to measure a SAR profile of an electromagnetic radiation emitting device includes the steps of: positioning an electromagnetic radiation emitting device such that it emits electromagnetic radiation into a portion of a phantom, projecting laser light through the portion of the phantom, collecting the light that is projected through the portion of the phantom, and analyzing the light that is projected through the portion of the phantom to determine the SAR profile of an electromagnetic radiation emitting device. In one of the variations of this aspect of the invention, the collecting the light includes collecting an interference pattern, and analyzing the light includes analyzing the interference pattern. In another variation of this aspect of the invention, the collecting the light includes measuring the deflection of the light as it passes through the phantom, and analyzing the light includes analyzing the deflection of the light as it passes through the phantom.

Additional advantages and novel features relating to aspects of the present invention will be set forth in part in the description that follows, and in part will become more apparent to those skilled in the art upon examination of the following or upon learning by practice of aspects thereof.

BRIEF DESCRIPTION OF THE DRAWINGS

The present invention will become fully understood from the detailed description given herein below and the accompanying drawings, which are given by way of illustration and example only and thus not limited with respect to aspects of the present invention, wherein.

DETAILED DESCRIPTION

Aspects of the present invention will now be described more fully hereinafter with reference to the accompanying drawings, in which variations and aspects of the present invention are shown. Aspects of the present invention may, however, be realized in many different forms and should not be construed as limited to the variations set forth herein; rather, the variations are provided so that this disclosure will be thorough and complete in the illustrative implementations, and will fully convey the scope thereof to those skilled in the art.

Unless otherwise defined, all technical and scientific terms used herein have the same meaning as commonly understood by one of ordinary skill in the art to which aspects of the present invention belong. The methods and examples provided herein are illustrative only and not intended to be limiting.

Figure 1:
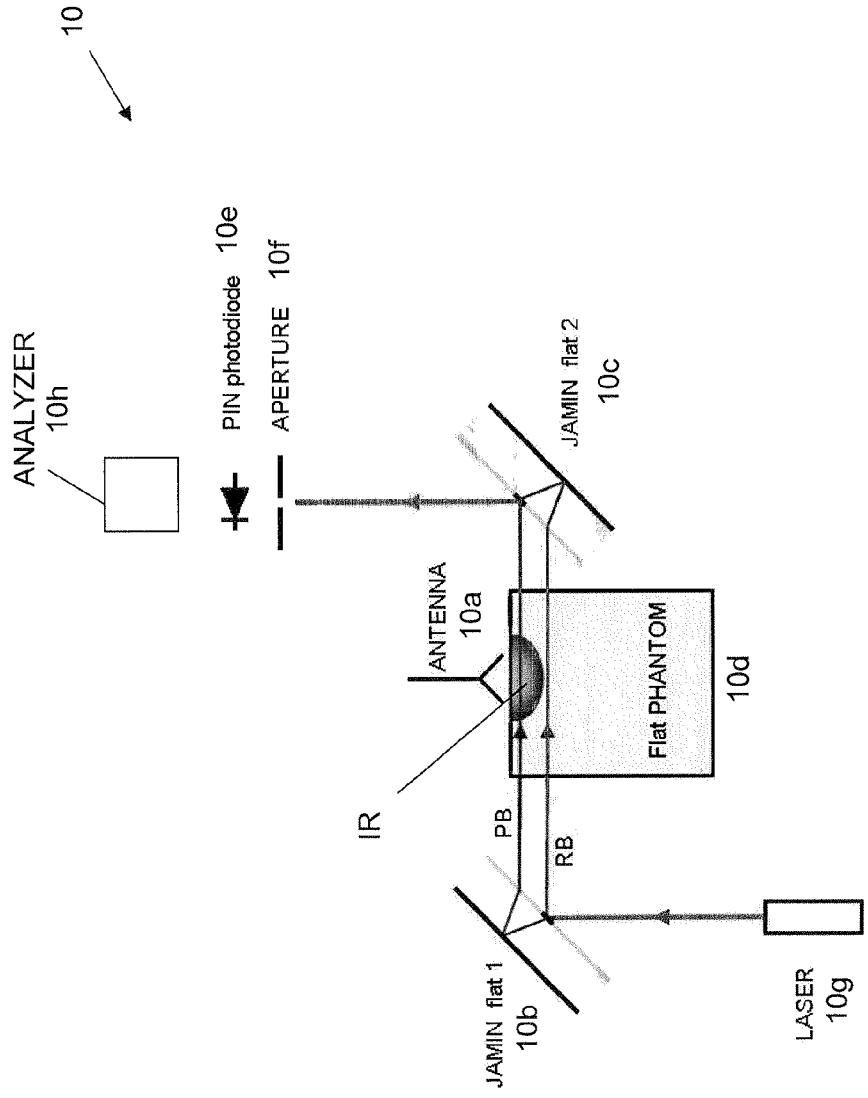
FIG. 1 is a schematic of a Jamin interferometer SAR measurement that may be used in conjunction with aspects of the present invention.

FIG. 1 is a schematic of a Jamin interferometer SAR measurement setup 10 that may be used in conjunction with aspects of the present invention. The system 10 in FIG. 1 is designed to use a photo-thermal interferometric measurement of temperature rise versus time immediately after a phantom has been irradiated by an ANTENNA 10a or other electromagnetic radiation emitting device.

As shown in FIG. 1, the setup 10 may include two Jamin interferometer flats 10b and 10c (generally, although not exclusively, two mirrors of relatively thick glass or other suitable transparent material). The mirrors in the Jamin interferometer flats 10b and 10c may include any suitable reflective surface. The setup also includes an ANTENNA 10a, which may be substituted by a cellular telephone or any other suitable electromagnetic radiation emitting device for which it is desired to obtain an SAR profile. The phantom may be a Flat PHANTOM 10d, as shown in FIG. 1, or it may have sides that are not rectilinear and/or curved. In addition, the phantom may have an anthropomorphic shape such that it resembles a human head or some other suitable anatomical portion. The ANTENNA 10a or other electromagnetic radiation emitting device is positioned such that it emits Radiation, as shown in FIG. 1, into the phantom. It is the radiation emitted from the ANTENNA 10a or other electromagnetic radiation emitting device that, among other things, is measured by the setup 1.

In the configuration shown in FIG. 1, the Fresnel reflection from the first surface of the mirror (e.g., the outer glass) acts as a beam splitter, such that the mirror reflects two beams, a probe beam (PB) and a reference beam (RB). These beams pass through the Flat Phantom 10d, as shown, and are recombined at Jamin interferometer flat 10c, where they ultimately form an interference pattern collected by the PIN photodiode 10e through the APERTURE 10f. The electromagnetic radiation emitted by the ANTENNA 10a or other electromagnetic radiation emitting device will cause an additional phase shift in the light beam that traverses the volume of the phantom affected by the electromagnetic radiation, which can be deconvoluted and analyzed using the interference pattern measured via the PIN photodiode 10e. For example, the phase shift caused by the electromagnetic radiation can be determined analyzing interference intensity using the ANALYZER 10h to find the maxima and minima and then determined the small, less than half cycle phase shift. From this measurement, a temperature and SAR profile inside the affected area of the phantom can be derived. Multiple LASERS 10g may be added to the setup 10 in FIG. 1 in order to access multiple portions of the irradiated region IR contemporaneously, for example. Alternatively or in addition, the LASER beams may raster or scan the irradiated region IR in order to obtain three dimensional phase shift data.

Figure 2:
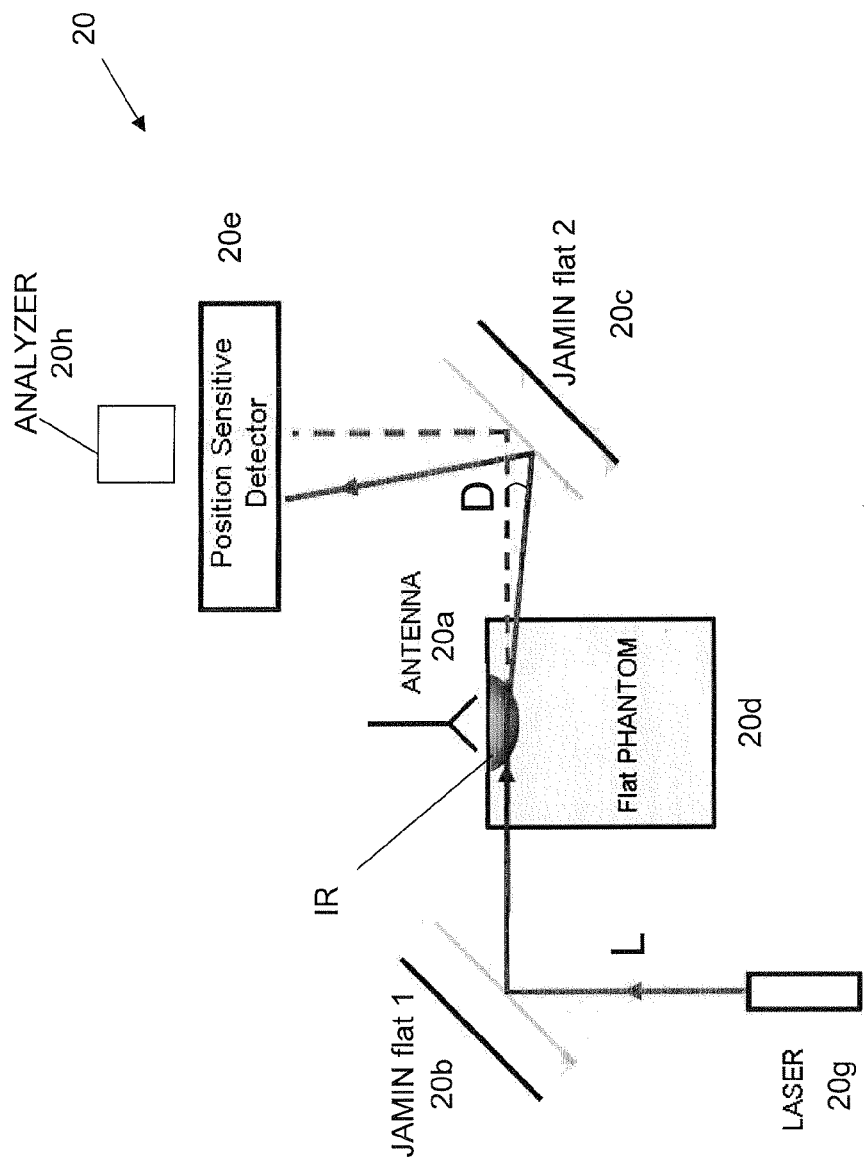
FIG. 2 is a schematic of beam deflection SAR measurement that may be used in conjunction with aspects of the present invention.

FIG. 2 is a schematic of beam deflection SAR measurement that may be used in conjunction with aspects of the present invention. The system 20 in FIG. 2 is designed to use photo-thermal beam deflection to perform a rapid SAR assessment using Jamin interferometer flats as mirrors and a beam deflection measurement using a PSD.

As shown in FIG. 2 the setup 10 may include an ANTENNA 20a or other electromagnetic radiation emitting device, two Jamin interferometer flats 20b and 20c (generally, although not exclusively, two mirrors of relatively thick glass or other suitable transparent material). The mirrors in the Jamin interferometer flats 20b and 20c may include any suitable reflective surface. The setup also includes an ANTENNA 20a which may be substituted by a cellular telephone or any other suitable electromagnetic radiation emitting device for which it is desired to obtain an SAR profile. As with any of the other variations described herein, the phantom may be a Flat PHANTOM 20d, as shown in FIG. 2, or it may have sides that are not rectilinear and/or curved. In addition, the phantom may have an anthropomorphic shape such that it resembles a human head or some other suitable anatomical portion. The phantom may be filled with liquid or solid material. The ANTENNA 20a or other electromagnetic radiation emitting device is positioned such that it emits radiation into an irradiated region IR of the phantom, as shown in FIG. 2, into the phantom. It is the radiation emitted from the ANTENNA 20a or other electromagnetic emitting device that, among other things, is measured by the setup 10.

In the configuration shown in FIG. 2, the Jamin interferometer flats 20b and 20c simply act as mirrors to direct light beam L from the laser 20g. This beam passes through the Flat Phantom 20d, as shown, is then reflected by Jamin interferometer flat 20c to a PSD 20e. The electromagnetic radiation emitted by the ANTENNA 20a or other electromagnetic radiation emitting device will cause a temperature increase in the affected phantom medium. This temperature increase will result in a deflection D of the light beam as it traverses the volume of the phantom affected by the electromagnetic radiation. The rate of change of the deflection of light beam L is then used to determine the SAR profile of the ANTENNA 20a or other electromagnetic radiation emitting device. In particular, the energy imparted to the phantom medium will be related to the rate of temperature increase (and, therefore, the beam deflection) by the heat capacity of the medium. Other factors may also be taken into account and included in this analysis which may be performed by an analyzer, computer or other suitable device discussed herein. From this measurement of deflection, temperature gradients and SAR profiles inside the affected area of the phantom can be derived. The SAR profile is then relatively easily derived from the temperature and or deflection profiles using the heat capacity of the phantom material, again via the use of an ANALYZER 20h, computer or other suitable device discussed herein. Multiple LASERS 20g may be added to the setup in FIG. 2 in order to access multiple portions of the irradiated region IR contemporaneously. Alternatively or in addition, the LASER beams may raster or scan the irradiated region IR in order to obtain three dimensional deflection data or deflection data in three dimensions.

The rapid SAR measurement systems 10 and 20 shown in FIGS. 1 and 2, respectively, can provide a virtually instantaneous (e.g., ≤60 seconds) assessment of the SAR produced by a cellular telephone, or other electromagnetic radiation emitting device, in a testing medium. Further, the systems 10 and 20 are sufficiently similar such that they can be obtained using a similar and relatively simple apparatus. Switching between the two different optical techniques involves substituting the APERTURE 10f and PIN photodiode 10e of system 10 for the PSD of system 20, and vice versa. However, other modifications of the system are also possible, in which various combinations of these measurements are obtained either successively or contemporaneously. Further, since the systems 10 and 20 and other variations of the invention described herein are optical and non-invasive, multiple phantoms can be used with the same apparatus. That is, different phantoms can be substituted for one another in a modular fashion without disrupting the measurement arrangement. This capability gives the user increased latitude to study many different types of phantom material, potentially representing different aspects of the human body, or the SAR profiles of test devices in different media altogether. In addition, since the phantom does not have to open to the air to accommodate a mechanical probe, the phantom can remain completely or nearly completely or nearly completely sealed, for example. The ability to use sealed phantoms allows the use of relatively inexpensive, accessible and benign phantom liquid (e.g., salt water and alcohol mixtures) that are prone to evaporation.

It should be noted that, since the measurement performed in systems 10 and 20, as well as many of the other variations described herein, is optical in nature, results can be obtained in a relatively short time. There is no need for the mechanical translation probe—the measurement time is dictated primarily by the data collection time. Data collection time depends on the detectors, but has the potential to be short (e.g., on order of 15 seconds or less). Because of this, systems 10 and 20, as well as all of the other variations described herein, can potentially accommodate multiple samples in rapid testing. For example, systems 10 and 20, as well as all of the other variations described herein, may be included as part of a device assembly facility in order to test random samples as they emerge from the assembly line.

It should further be noted that the systems 10 and 20 of FIGS. 1 and 2, respectively, and all similar variations of the present invention, are potentially self-calibrating. Since the measurement relies upon not an absolute laser beam location or orientation, but on a relative one (e.g., a change in laser beam location due to reflection), the apparatus need not be re-calibrated before every use. In fact, the nature of the measurement may not require user calibration at all beyond the initial setup, for similar reasons.

Figure 3:
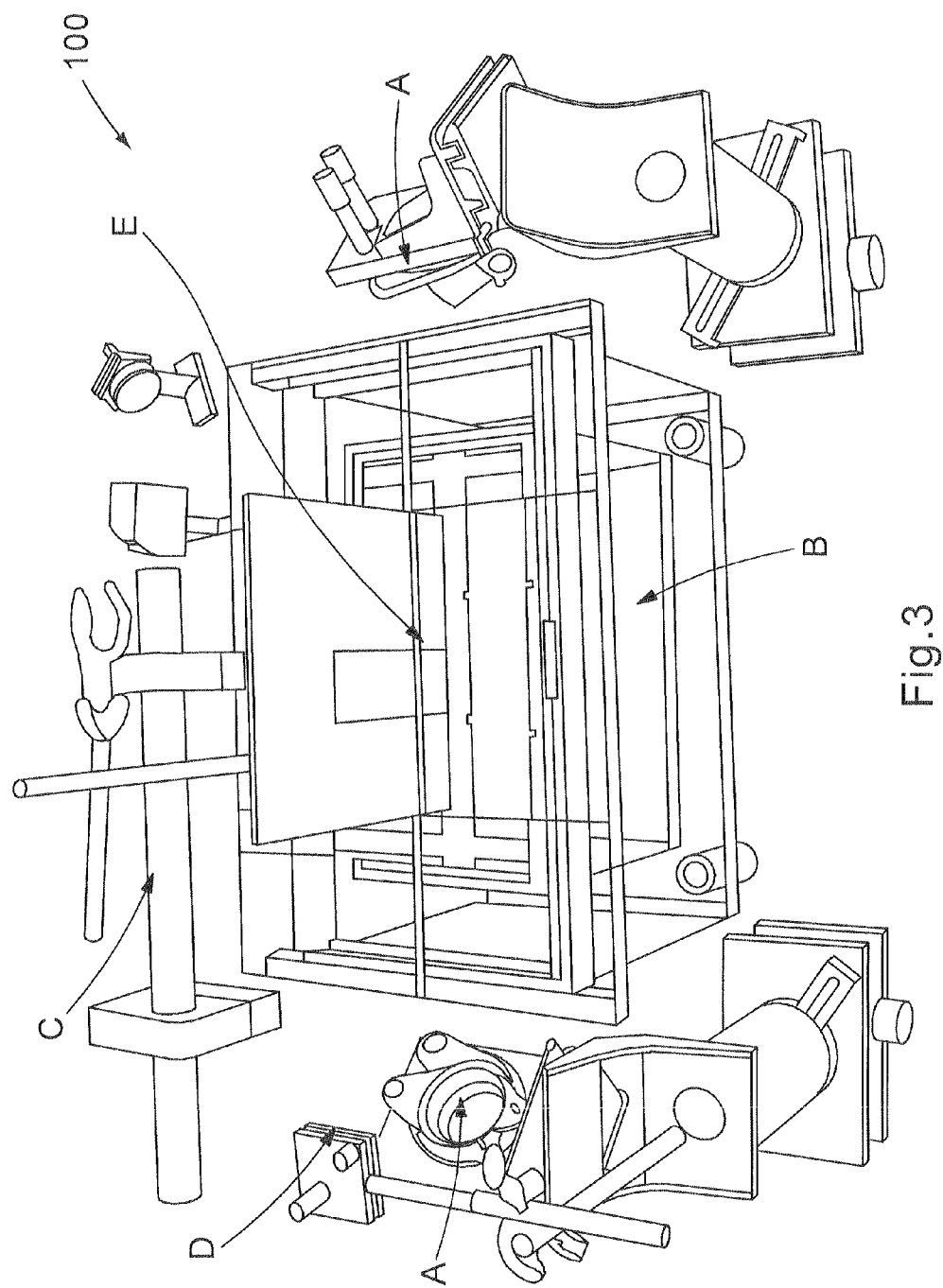
FIG. 3 is a photograph of an exemplary SAR measurement setup that may be used in conjunction with aspects of the present invention.

FIG. 3 is a photograph of an exemplary SAR measurement setup that may be used in conjunction with aspects of the present invention. The exemplary system 100 of FIG. 3 can contain the following components: (A) Jamin interferometer flats, (B) a double-walled flat phantom, (C) He-Ne laser, (D) PIN Photodiode in interferometer configuration and (E) Dipole antenna. Each of these components may be substituted by any of the suitable alternatives discussed herein. For example, the He-Ne laser C may be substituted for another type of laser, including argon lasers, excimer lasers, various diode lasers, as well as other solid state or semiconductor lasers. The PIN photodiode D may be substituted by a number of other suitable components, including both other types of photodiodes, as well as other components such as PSDs. The phantom B may be substituted for any of the suitable types of phantoms discussed herein, including single-walled phantoms and phantoms that have anthropomorphic shapes. Further, many different types of phantoms may be used in a modular phantom setup that may also include a phantom holder or carriage allowing phantoms to be exchanged with relative ease. The carriage or holder may itself be automated such that the exchange of phantoms is automated.

Note that the system 100 in FIG. 3 can be used to perform any of the suitable measurements described herein, including those discussed in the context of FIGS. 1 and 2. For example, in order to perform the interferometry measurement discussed in the context of FIG. 1, Component D may be a photodiode. Alternatively, in order to perform the beam deflection experiment discussed in the context of FIG. 2, component D in FIG. 3 can be a PSD. Any number of other suitable configurations and modifications are also possible.

The system 100 in FIG. 3 is not necessarily shown to scale and, in fact, can operate on several different scales or after changing the relative distance between the components. For example, it may be advantageous to separate the various components from one another to greater extent than shown in FIG. 3 in order to facilitate ease of component access during experiments. Alternatively, the components may be spaced more closely together so that the final, fully integrated system 100 is approximately the size of the phantom.

Figure 4:
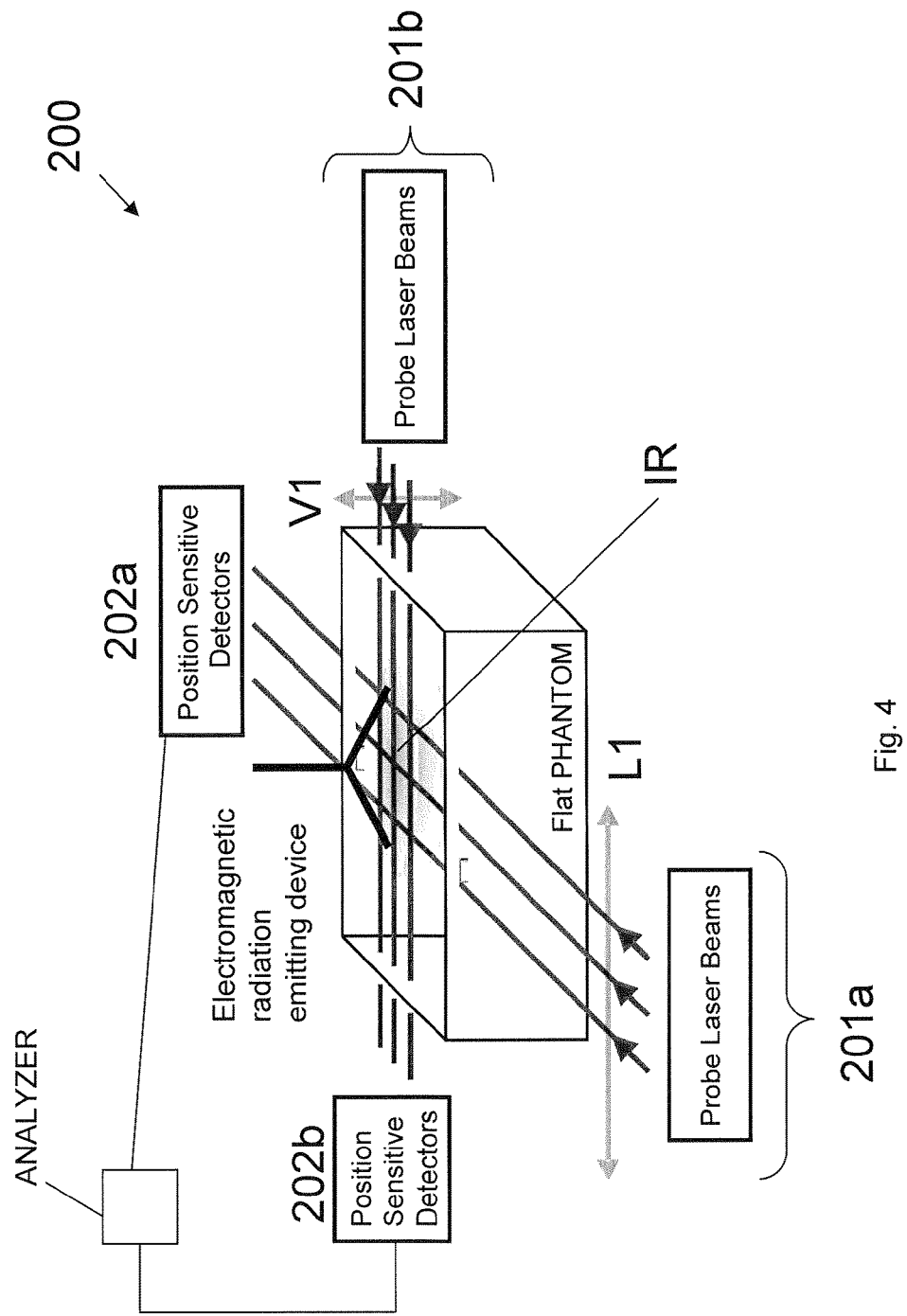
FIG. 4 is a representative schematic of an exemplary three dimensional beam deflection SAR measurement that may be used in conjunction with aspects of the present invention.

FIG. 4 is a representative schematic of an exemplary three dimensional beam deflection SAR measurement system 200 that may be used in conjunction with aspects of the present invention. In FIG. 4, a first set of probe laser beams 201a and their corresponding PSDs 202a is set up to record lateral deflection L1, and a second set of probe laser beams 201b and their corresponding PSDs 202b is be set up to record vertical deflection V1. In fact, each of the lasers of sets 201a and 201b will be deflected by the irradiated region IR in both vertical and in lateral directions. However, it can be advantageous to use linear position sensitive PSDs that collect only one aspect of the deflection (e.g., vertical or lateral deflection as shown in FIG. 4). One of the advantages of the arrangements shown in FIGS. 4, in which each set of PSDs 202a and 202b records only one dimensional deflection, is that the arrangement provides a significant cost savings over using two dimensional PSDs without a substantial loss in accuracy. There are other advantages as well, since two dimensional PSDs can be difficult to calibrate, non-robust and otherwise tricky to implement. However, certain situations may call for the use of two dimensional PSDs (i.e., PSDs that can singlehandedly record two dimensional deflections). These situations include, among others, those in which physical space is a premium and/or in which only a limited number of lasers, for example, can be placed on a single side of the phantom. In these and other cases, alternative arrangements are possible, including having only a single set of probe lasers as well as multiple sets of probe lasers, for which deflections in multiple directions are recorded.

Figure 5:
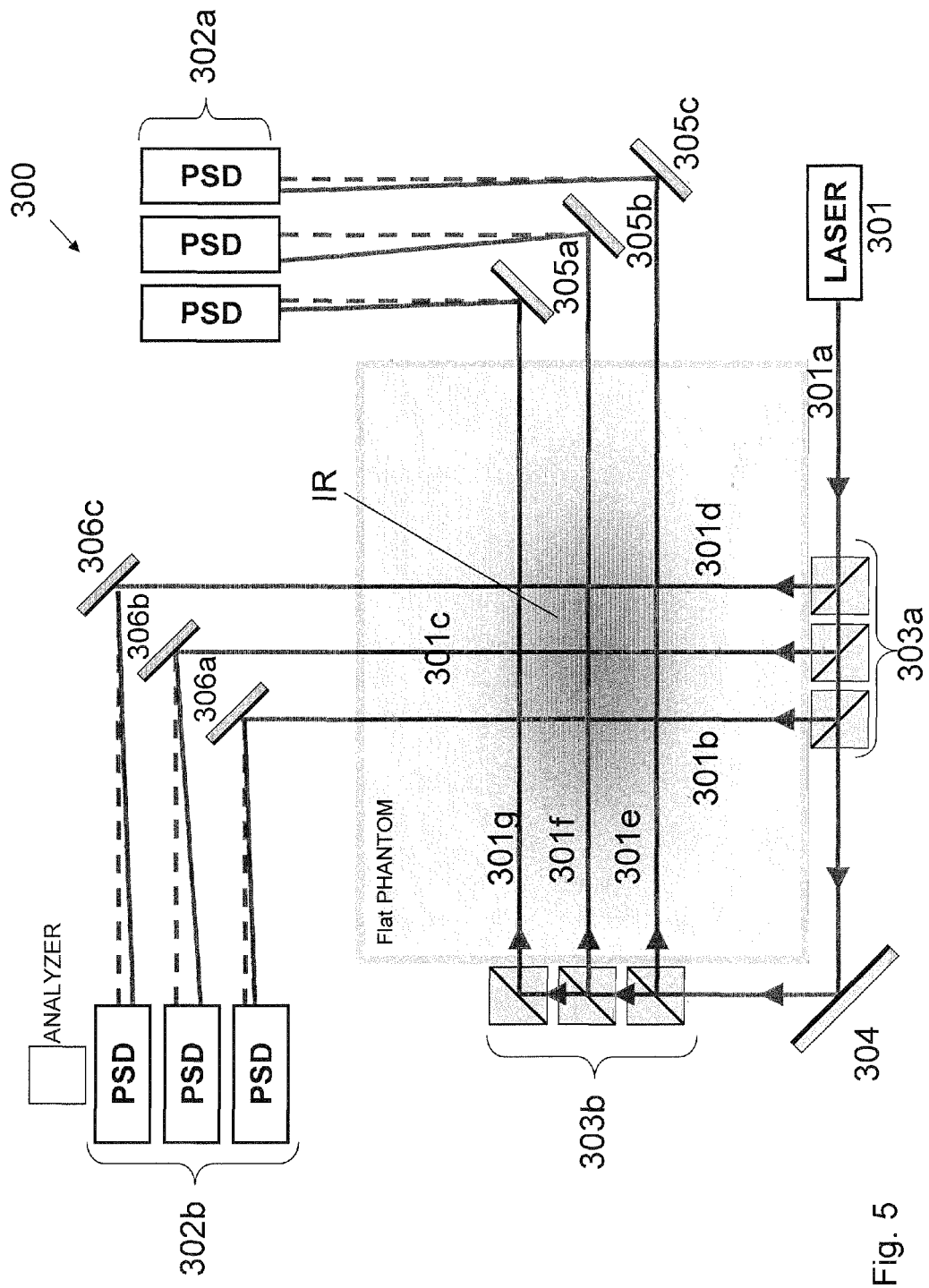
FIG. 5 is a representative schematic of an exemplary six beam deflection SAR measurement system where a single laser is split into the six beams.

FIG. 5 is a representative schematic of an exemplary six beam deflection SAR measurement system 300 where a single laser is split into the six beams. In FIG. 5, a probe laser 301 provides a laser beam 301a that can be split, for example, into six separate beams 301b-g by a series of partially reflective mirrors 303a and 303b and mirror 304. These six beams 301b-g can then be reflected to a corresponding PSD 302a or 302b via mirrors 305a-c and 306a-c. For example, each of the PSDs 302a may be set up to record lateral deflection L1 (FIG. 4) of beams 301e-g and each of the PSDs 302b may be set up to record vertical deflection V1 (FIG. 4) of beams 301b-d, vice versa or any other suitable combination. Each of the variations described with regard to the in the context of the system 200 shown in FIG. 4 above, or with any other system described herein, may also apply to the system 300 shown in FIG. 5.

Figure 6:
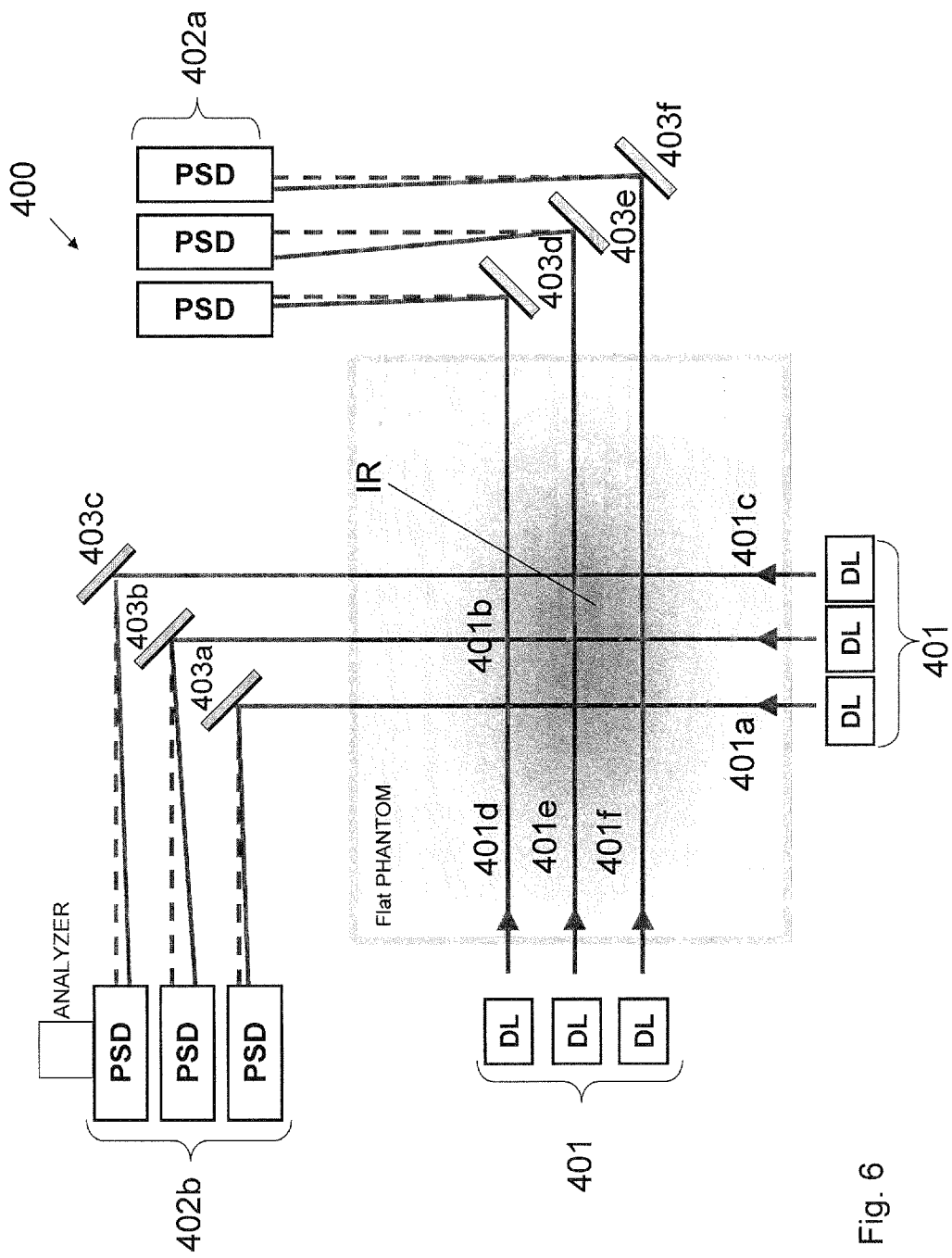
FIG. 6 is a representative schematic of an exemplary six beam deflection SAR measurement system where six separate lasers provide the six beams.

FIG. 6 is a representative schematic of an exemplary six beam deflection SAR measurement system 400 where six separate lasers provide the six beams. In FIG. 6, probe lasers 401 can provide six separate beams 401a-f to the irradiated region IR. These six beams 401a-f can then be reflected to a corresponding PSD 402a or 402b via mirrors 403a-f. For example, each of the PSDs 402a may be set up to record lateral deflection L1 (FIG. 4) of beams 401d-f and each of the PSDs 402b may be set up to record vertical deflection V1 (FIG. 4) of beams 401a-c, vice versa or any other suitable combination. Each of the variations described with regard to the in the context of the system 200 shown in FIG. 4 above, or with any other system described herein, may also apply to the system 400 shown in FIG. 6.

Figure 7:
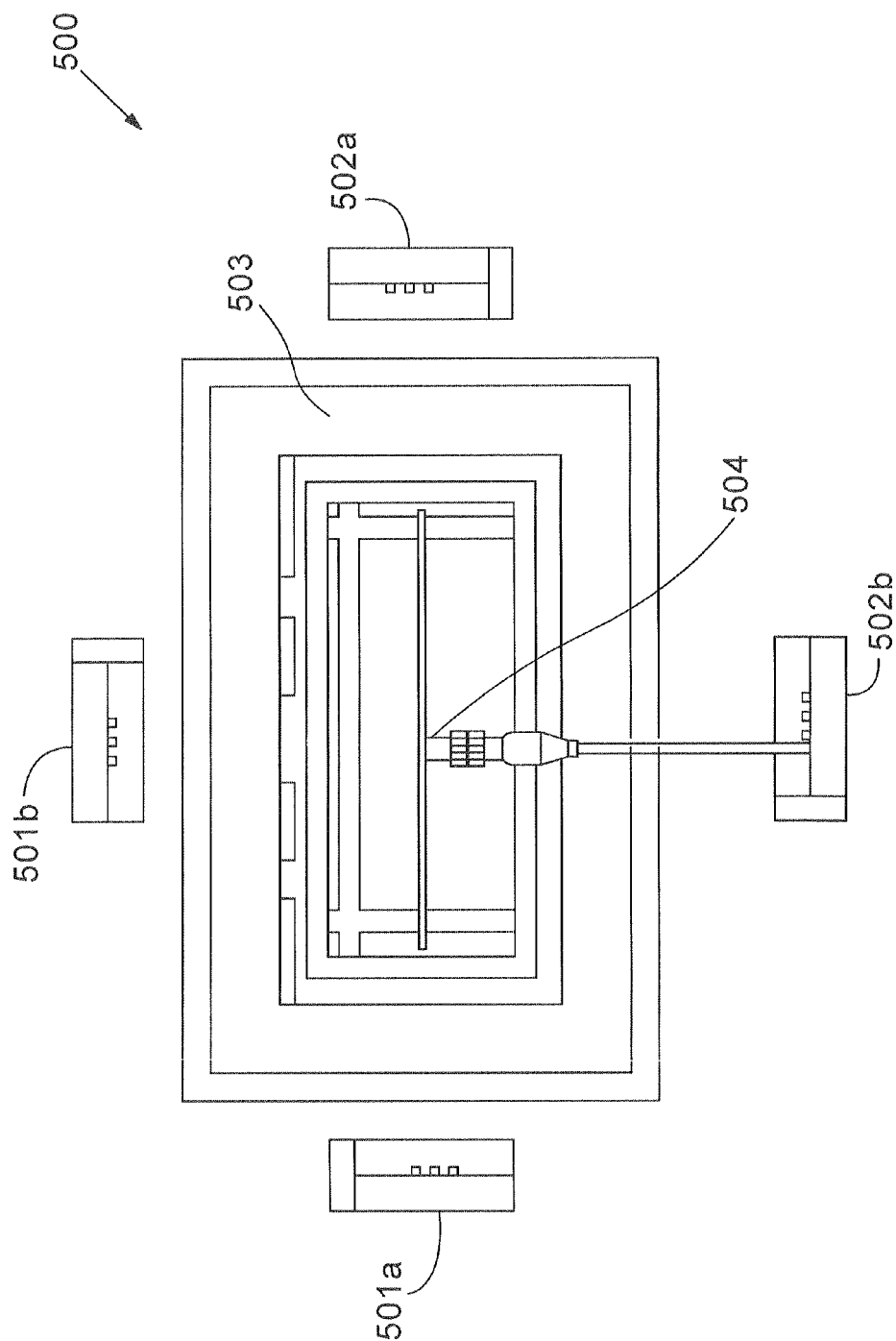
FIG. 7 is a top view of an exemplary SAR measurement setup using six separate lasers and six position sensitive detectors.

FIG. 7 is a top view of an exemplary SAR measurement setup 500 using six separate lasers and six position sensitive detectors. The exemplary system 500 of FIG. 7 can contain the any of the components discussed herein, including: lasers 501a and 501b, a double-walled flat phantom 503, PSDs 502a and 502b and dipole antenna 504. Each of these components may be substituted by any of the suitable alternatives discussed herein. For example, the lasers 501a and 501b may be substituted for another type of laser, including He Ne lasers, argon lasers, excimer lasers, various diode lasers, as well as other solid state or semiconductor lasers. The PSDs 502a and 502b may be substituted by a number of other suitable components, including types of photodiodes, as well as other suitable types of PSDs. The double-walled flat phantom 503 may be substituted for any of the suitable types of phantoms discussed herein, including single-walled phantoms and phantoms that have anthropomorphic shapes. Further, many different types of phantoms may be used in a modular phantom setup that may also include a phantom holder or carriage allowing phantoms to be exchanged with relative ease. The carriage or holder may itself be automated such that the exchange of phantoms is automated.

Figure 8:
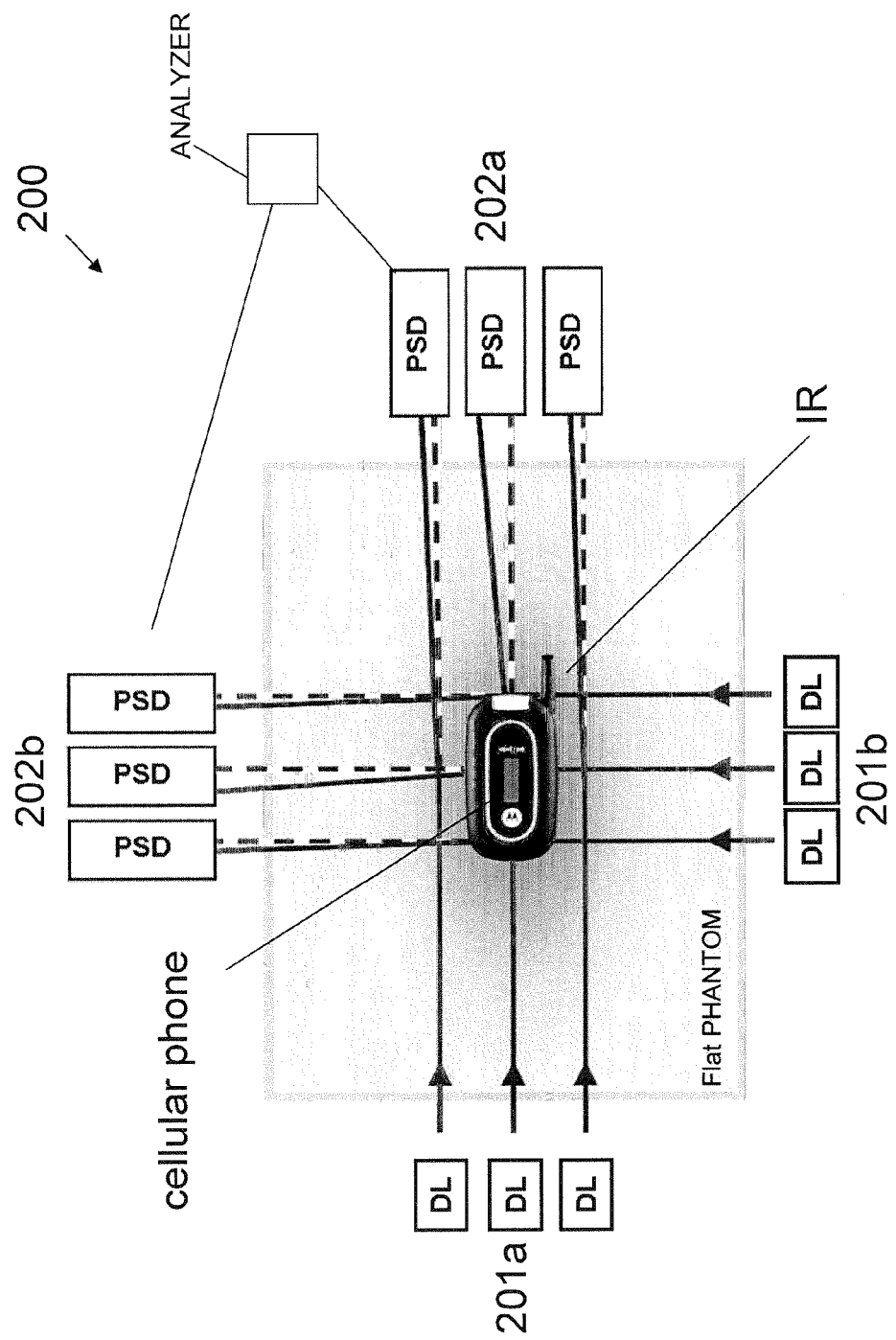
FIG. 8 is a schematic top view of the exemplary three dimensional beam deflection SAR measurement of FIG. 4 including a cellular telephone.
Figure 9:
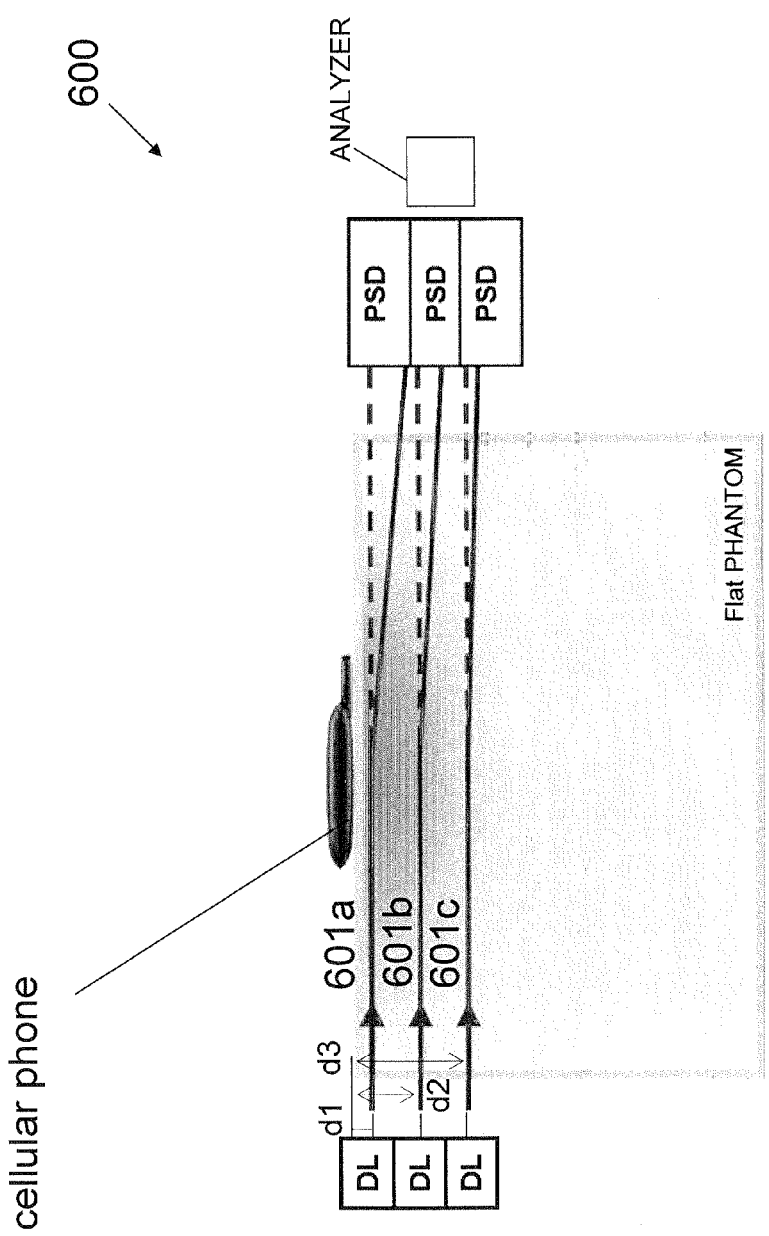
FIG. 9 shows a side view of how beam deflections of three beams at different depths may vary with depth into an exemplary flat phantom.

FIG. 8 is a schematic top view of the exemplary three dimensional beam deflection SAR measurement system 200 of FIG. 4 including a cellular telephone. FIG. 9 shows a side view of another system 600 that may use deflections of three beams 601a-c at different depths d1-d3 into an exemplary flat phantom 602 to create, among other things, a three dimensional SAR profile. The system 600 shown in FIG. 9 may be used in conjunction with any of the other systems described herein, including those shown in FIGS. 1-8 as well as those described subsequently.

As shown in FIGS. 4, 5, 6, 8 and 9, multiple laser beams can be provided on each side of the phantom. Although FIGS. 4, 5 and 6 show a total of six laser beams, it is to be understood that this is merely exemplary. Any suitable number of probe laser beams may be provided in any suitable arrangement. Further, although FIGS. 4, 5 and 6 show lasers placed around the periphery of the phantom, such that each successive beam is placed to the side of the previous beam, the lasers may be placed in other arrangements in other variations of the present invention. The layouts in FIGS. 4, 5 and 6 are purely exemplary and it is to be understood that any suitable arrangement of beams is possible. For example, it may be advantageous to have the laser beams arranged in a grid, checkerboard or other pattern.

In operation, the electromagnetic radiation emitting device is placed on top of the phantom, as shown in FIGS. 4 and 8. However, other arrangements are also possible. For example, the electromagnetic radiation emitting device may instead be placed in any other suitable arrangement with respect to the phantom (e.g., facing one of the other sides of the phantom or underneath the phantom). In the arrangement in FIGS. 4, 5, 6, 8 and 9 the electromagnetic radiation emitting device, upon activation, then creates the irradiated region IR near the top of the phantom, as shown in FIG. 4. Laser beams then probe this region, as shown in FIGS. 4, 5, 6, 8 and 9. Note that each laser beam has a corresponding PSD placed on the opposite side of the phantom, as shown in FIGS. 4, 5, 6, 8 and 9. There may be a single PSD per laser beam, PSDs may be shared between multiple beams or there may be multiple PSDs for each laser beam. The arrangements in FIGS. 4, 5, 6, and 8 can measure deflection for a single plane in the irradiated region IR of the phantom. Three dimensional profiles of the irradiated region IR may be accomplished by adding additional sets of probe laser beams, as described further below and shown for example in FIG. 9.

Other arrangements are also possible. For example, either the lasers or the PSDs may be oriented differently than shown in FIGS. 4, 5, 6, 8 and 9, with respect to the phantom or with respect to each other, and the light beams may be directed by a series of mirrors, optical fibers and/or other light transmitting media. FIGS. 4, 5, 6, and 8 show that two sets of laser beams oriented orthogonally to each other can probe the sheet of liquid or other medium making up the irradiated region IR directly below the surface of the phantom.

Each of the sets of probe laser beams shown in FIGS. 4, 5, 6, 8 and 9 samples a different portion of the irradiated region IR of the phantom contemporaneously, for example. In this sense, the deflection of each of the beams can be measured and compiled into a three dimensional grid or map of the deflection, as shown in FIGS. 10, 11, 12, and 13. The deflection map can ultimately be converted into a temperature map of the irradiated region IR of the phantom and/or a three dimensional SAR profile. Alternatively, the deflection recorded at the PSDs for each beam can be independently converted to a temperature or a SAR element, and then, subsequently, the results can be compiled into a three dimensional map of either quantity.

As with many of the variations of the invention described herein, an additional set of laser beams could also added to map the deflection (or phase shift), and thus temperature, as a function of depth. The additional set or sets of lasers could simply be provided along the dimension of the phantom orthogonal to the phantom surface exposed to the electromagnetic radiation emitting device. The three dimensional data obtained by this system could then be de-convoluted by software, for example, to create a three dimensional image of the data in a manner similar to that used in the analysis of Computer Aided Tomography scan data. Such an exemplary mapping scheme could then allow the locations of multiple peaks to be approximately located. Particular telephones or electromagnetic radiation emitting devices, for example, could be used that would require multiple exposures and measurements in multiple telephone positions (e.g., with calibrated translations) to refine the locations and ensure that each of the multiple SAR maxima are accurately characterized. Variations of the invention described herein would accommodate such a testing protocol.

Figure 10:
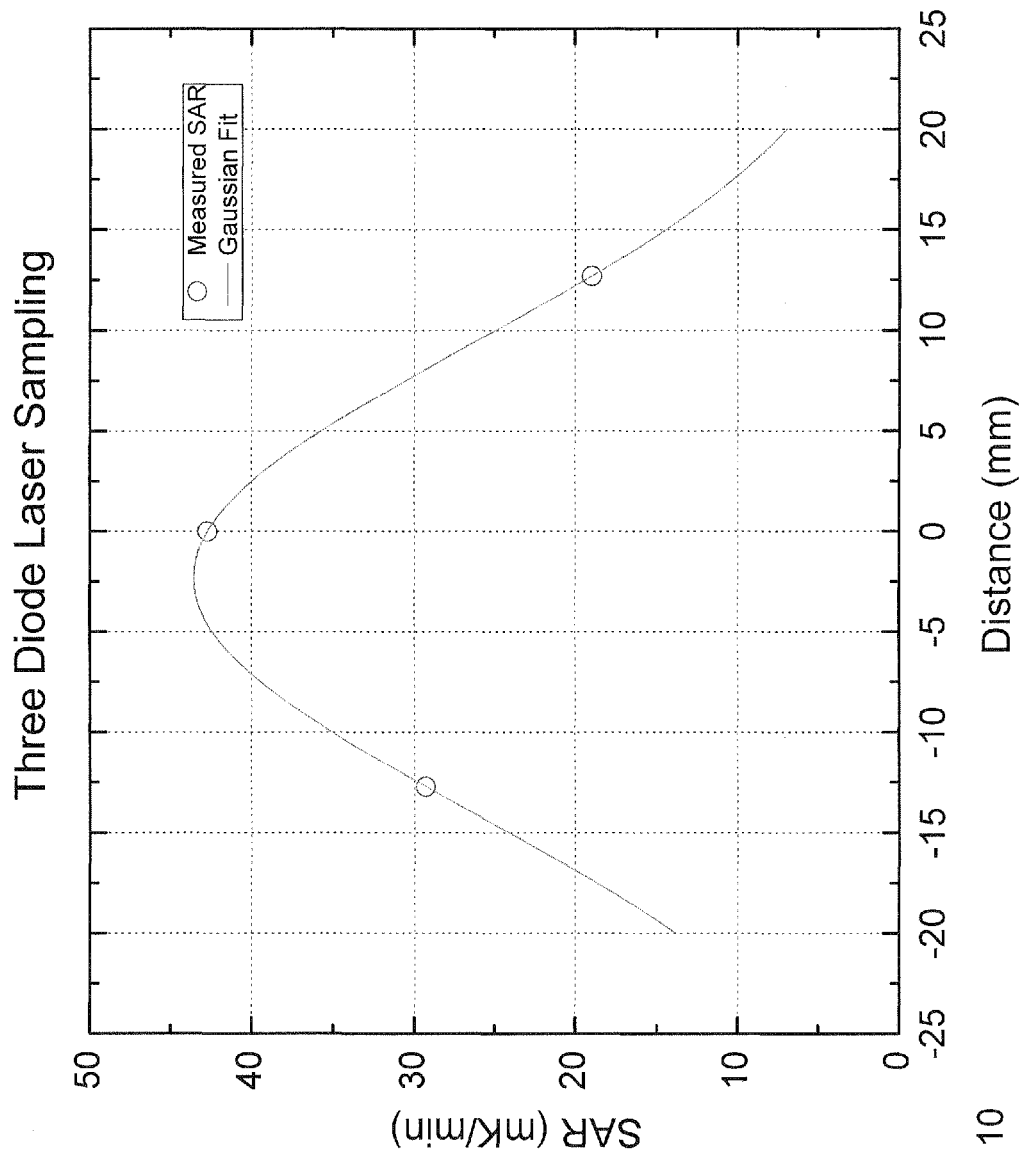
FIG. 10 shows a computer fit to beam deflection data for three beams showing a calculation of SAR along the paths.
Figure 11:
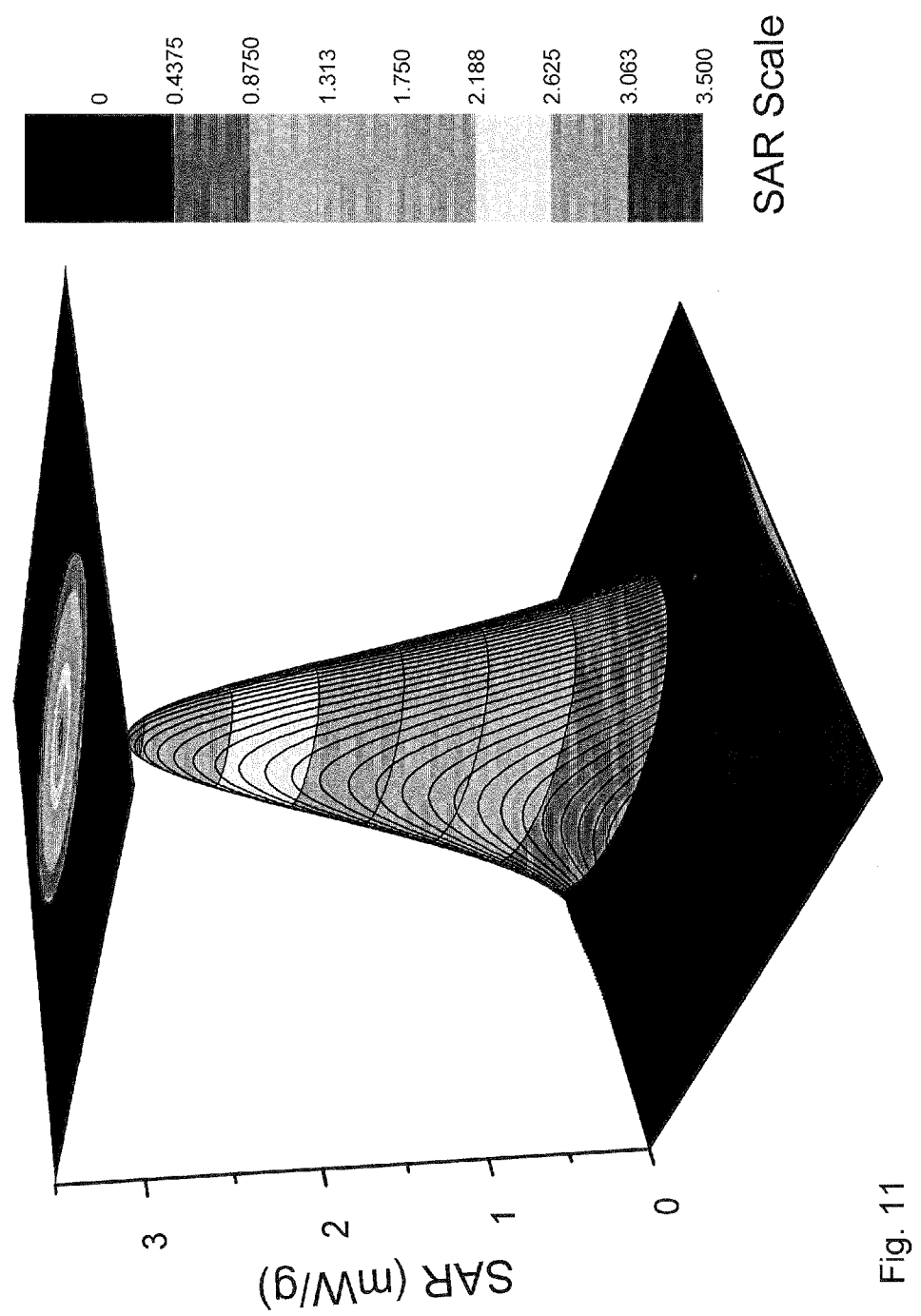
FIG. 11 is an exemplary three dimensional SAR profile that may be computed from measurements such as those shown in FIG. 10.
Figure 12:
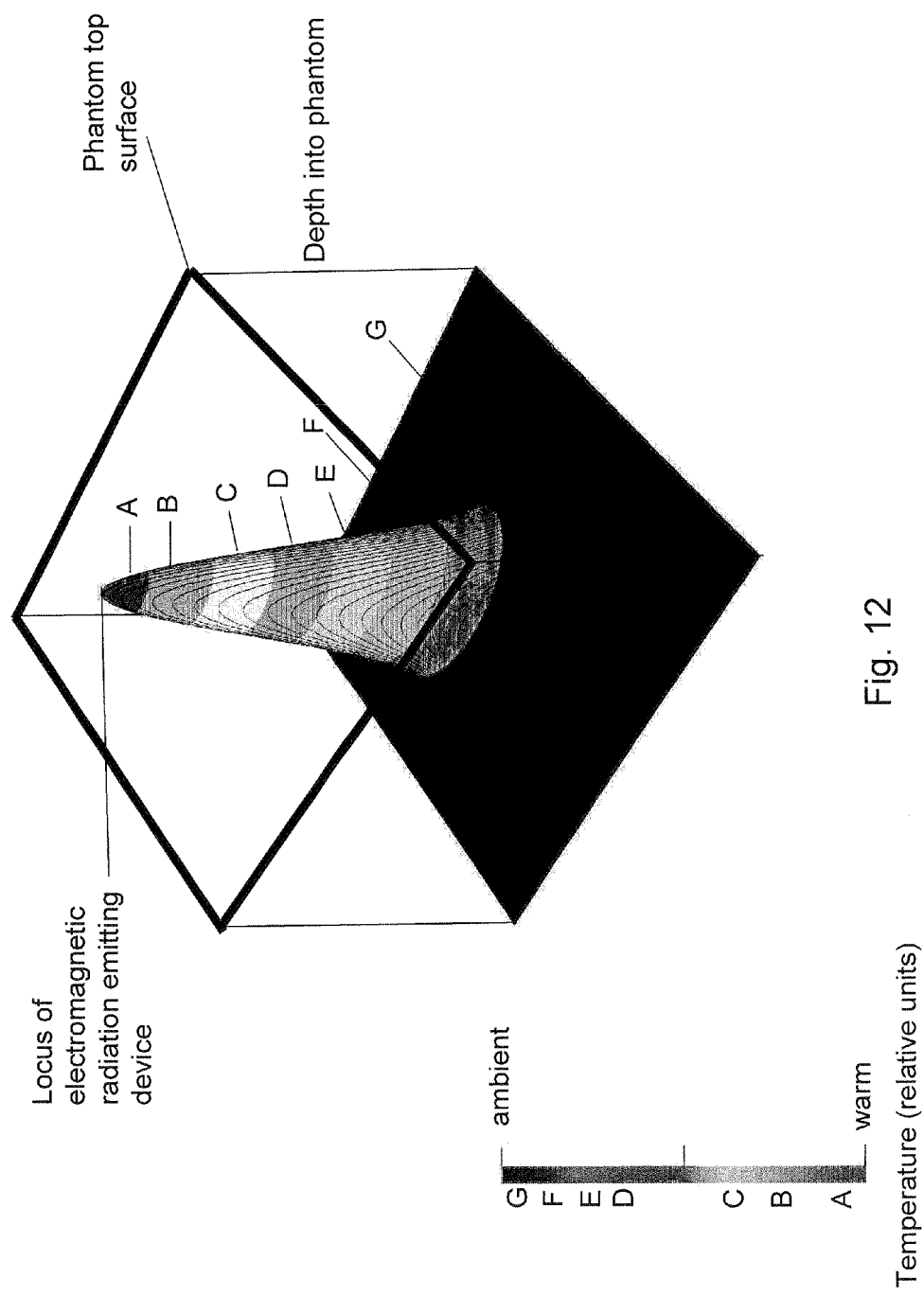
FIG. 12 is another exemplary three dimensional SAR profile that may be computed from measurements such as those shown in FIG. 10. This figure shows the location of the SAR distribution relative to the RF device and phantom.

FIGS. 10, 11, and 12 show exemplary three dimensional SAR profiles that may be computed from measurements such as those shown in FIGS. 1-9. FIG. 10 shows a computer fit to beam deflection data for three beams showing a calculation of SAR along the paths. FIG. 11 is an exemplary three dimensional SAR profile that may be computed from measurements such as those shown in FIG. 10. The scale is shown in the figure. FIG. 12 is another exemplary three dimensional SAR profile that may be computed from measurements such as those shown in FIG. 10. FIG. 12 shows the location of the SAR distribution relative to the RF device and phantom.

It should be noted that the data shown in FIGS. 10-12 is merely illustrative of the variations and types of presentations of temperature, energy absorption, deflection or interferometry data that may be obtained by systems described herein. FIGS. 10-12 do not display actual data taken by any of the measurement techniques described herein. As indicated in FIG. 12, the plot is meant to simulate a temperature profile created throughout the depth of a phantom, near its surface, by a centrally located electromagnetic radiation emitting device. Alternatively, the data displayed in the format shown in FIG. 12 may include any number of other parameters, including absorbed energy, phase shift or beam deflection. The data displayed in a plot such as that shown in FIG. 12 could be obtained using any of the techniques and variations of the invention described herein, as appropriate.

In one exemplary variation, the plot such as that shown in FIG. 12 includes a color-coded temperature scale so that the heat generated by the electromagnetic radiation emitting device can be ascertained visually. Here, for example, two dimensional slices of beam deflection data taken by the apparatus shown in FIGS. 4, 5, 6, 8 and 9 could be stitched together using appropriate software to form the three dimensional image shown. Since each laser beam provides deflection data that corresponds to a two dimensional "slice" of the irradiated region IR, it is advantageous to include multiple crossed beams as shown in FIGS. 4, 5, 6, 8 and 9. The three dimensional profile in FIG. 12 can be accomplished by having multiple sets of lasers, including those in the direction orthogonal to the phantom surface closest to the electromagnetic radiation emitting device. The data from each beam can then be compiled by software to create a three dimensional profile of the SAR in the phantom. As indicated above, the image compilation can be accomplished with similar software used in the compilation of three dimensional images from CAT scan or other scanning tomography or microscopy data.

The scale in FIG. 12 is color-coded according to relative temperature and labels A-F stand for different colors and their corresponding temperatures according to the relative temperature scale at left in the figure. However, it is to be understood that such a plot can be obtained using data of any form discussed herein. The color coding shown in FIG. 12 could, for example, used to reflect the intensity of a beam deflection or the amount of energy absorbed per unit volume in the phantom. Alternatively, or in addition to the color coding shown in FIG. 12, the data may also exhibit contours that represent isothermal regions, or regions with identical phase shift, beam deflection or energy absorption, etc.

Other variations of the systems 10, 20, 100, 200, 300, 400 and 500 of FIGS. 1, 2, 3 and 4, 5, 6, 8 and 9, respectively, not described above are also within the context and scope of aspects of the present invention. For example, systems 10, 20, 100, 200, 300, 400 and 500, as well as other variations discussed herein, may be completely or nearly completely or partially autonomous, using computerized calibration, system checks, and prompts for operator placement of a wireless device to be tested. Systems 10, 20, 100, 200, 300, 400 and 500, as well as other variations discussed herein, may be driven remotely through a graphical user interface or by other means, or it may be advantageous to retain some locally operated adjustments and controls. Systems 10, 20, 100, 200, 300, 400 and 500, as well as other variations discussed herein, may be included in various implements that allow rapid testing of multiple samples. For example, systems 10, 20, 100, 200, 300, 400 and 500, as well as other variations discussed herein, may be connected to a conveyer belt or other sample feed that provides multiple electromagnetic radiation emitting devices for testing. Accordingly, systems 10, 20, 100, 200, 300, 400 and 500, as well as other variations discussed herein, may include various features that allow the devices for testing to be mounted automatically near the phantom or in another advantageous testing position. Such features may include the use of other conveyers, robotic arms and or remotely actuated grasping tools, as well as other suitable features.

A double-walled flat or non-flat phantom may also be used in variations described above, including in systems 10, 20, 100, 200, 300, 400 and 500 as shown in FIGS. 1, 2, 3, 4, 5, 6, 8 and 9, respectively, as well as other variations discussed herein. A double-walled phantom is defined as a liquid (or other medium) filled tank nested in a larger tank that is filled with another medium (e.g., a liquid, gas or gel). Generally the medium in the larger tank has a lower thermal conductivity than the medium in the nested tank in order to thermally isolate the medium in the nested tank from heat generated by the electromagnetic radiation emitting device or other ambient temperature fluctuations. However, more complicated configurations are also possible in order to thermally isolate either the medium in the innermost phantom tank from other components, or to thermally isolate other components from each other.

To allow testing of multiple wireless frequencies individually or contemporaneously, many different kinds of transparent simulant fluid, gel or other medium in the phantom may be used. Experimental results presented below show that saltwater/alcohol mixtures can provide any desired combination of $\epsilon'$ and $\sigma$ at frequencies from 1-20 GHz. Further, broadband simulants can be developed with tertiary mixtures of water, an alcohol, and salt to extend this implementation. These simulants should also be considered to be in accordance with aspects of the present invention. Since the phantoms do not need to be open to the atmosphere, as no probes need to be inserted; simulants that might evaporate in an open environment can be used. Calibration of the temperature coefficient for refractive index change in the simulant can be easily provided. Absolute SARs can also be checked by comparing wireless devices to be tested against a standard dipole antenna, for example, for which the SAR pattern in the flat phantom can be analytically computed.

In the exemplary experimental setups of FIG. 1-9, the phantom can act as a static calorimeter and with no temperature control or mixing homogenization features. However, other variations are possible, in which the temperature of the phantom is controlled (e.g., set to human body temperature or another temperature) and mixing homogenization features may be installed. Variations are within the scope of aspects of the present invention.

Generally, it has been found that an average-sized flat phantom such as that shown in FIG. 3, takes approximately 3-5 minutes to reach ambient temperature after it has been heated by an electromagnetic radiation emitting device. This relatively short time constant comes from the fact that the RF heats only a few cm into the phantom. Modifications of the phantom and other portions of the system 100 may speed up the procedure by which the temperature of the phantom settles back to ambient temperature. Speeding up this procedure may allow the ability to minimize thermal (as opposed to electromagnetic) heating of the phantom, thereby allowing the telephone or other electromagnetic radiation emitting device to be removed as soon after the SAR is determined via deflection or interferometry measurements.

EXAMPLES

The following results using variations of the systems described herein demonstrate the use of two complementary optical methods to provide detection of the SAR temperature distribution in various phantoms, in accordance with aspects of the present invention. Either of the techniques may be used independently, or both may be used in tandem. Suitable implementations include their use in an instrument for fast SAR compliance assessment. The examples below demonstrate measurements from the SAR limit of 22.8 mK/min (corresponding to 1.6 W/kg) and above and down to 1.4 mK/min (0.07 W/kg). The results obtained are repeatable to the order of 10% or better. Best results are currently observed within the first minute of exposure time, although measurement time can be shortened or lengthened as needed.

As shown in the results described further below, the system 100 of FIG. 3 was tested at 900 and 1800 MHz. It is to be understood, however, that the system may work at even higher frequencies without modification. In certain variations, the laser beams can be approximately 0.5 mm in diameter or smaller and allowing the interrogation of phantom regions of the phantom up to its outer surface. In the experiments described below, the probe laser beams run parallel to the surface of the phantom closest to a telephone. Usually, around 3 mm distance is maintained between the surface of the phantom and the beam, for example. For the 900 and 1800 MHz bands, laser probing at distances of about 3 to 11 mm from the surface of the phantom has provided adequate response. However, other configurations are possible, both for measuring these and additional bands. In particular, by moving the electromagnetic radiation emitting device laterally with respect to the laser beam, and/or by moving the laser beam vertically (e.g., closer to the telephone) spatial SAR maps can be produced with even a single beam. These results would mimic the results obtainable with multi-beam systems, such as those shown in FIGS. 4, 5, 6, 8 and 9.

Figure 13:
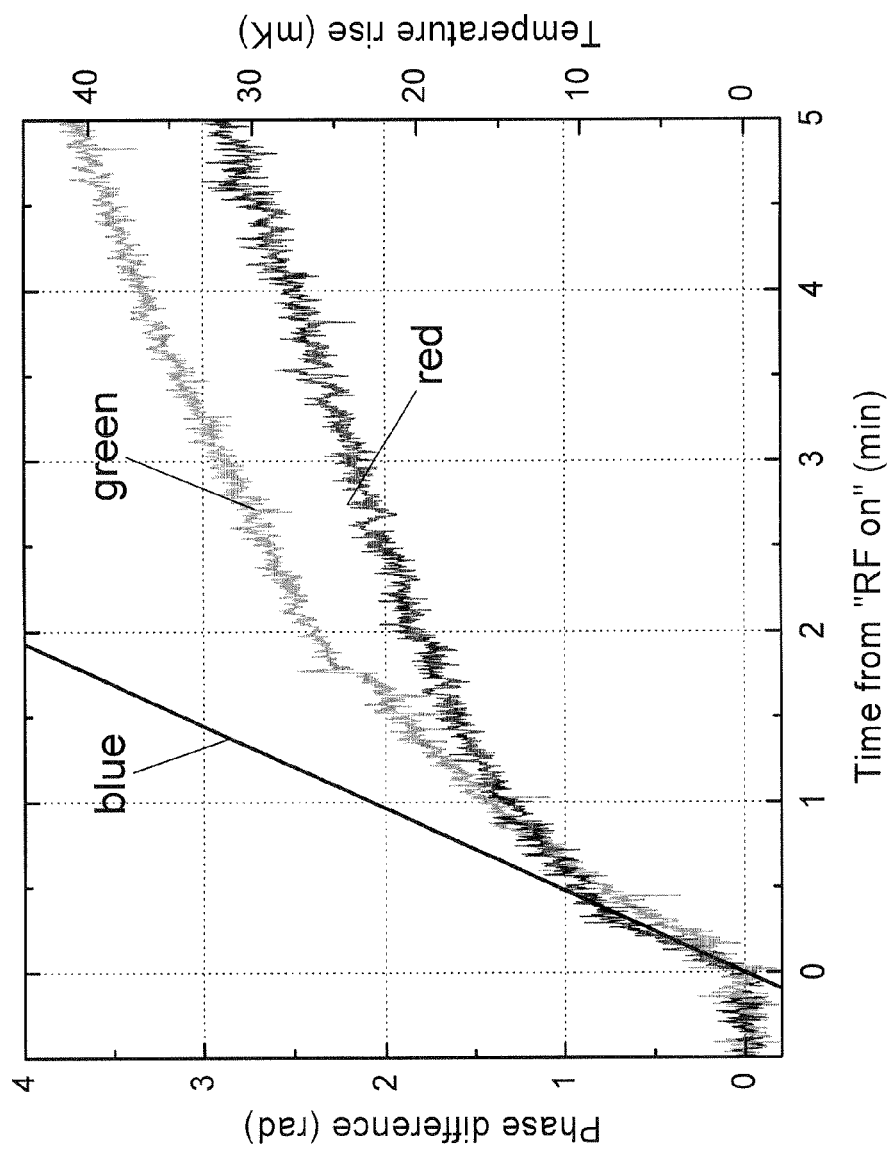
FIG. 13 shows the phase difference and temperature rise measured with the Jamin interferometer as a function of time from turning ON the Dipole antenna E shown in FIG. 3 in accordance with aspects of the present invention.

The measurements described in the context of FIG. 1 above were tested with a Double-walled phantom and two different antennas (900 MHz and 1800 MHz) using two power inputs (325 mW and 10 mW). FIG. 13 shows the phase difference and temperature rise measured with the Jamin interferometer (system 10, FIG. 1 and FIG. 3) as a function of time from turning Dipole antenna E shown in FIG. 3 ON. The medium in the innermost tank of the Double-walled flat phantom B was a 0.1 M liquid solution of NaCl in water. The laser beam was directly below and parallel to the Dipole antenna E around ~6 mm into the phantom liquid. Other parameters were as follows: RF input power of 325 mW. Data plotted in green is the interferometry data from the 900 MHz antenna (initial slope=15.8±1% mK/min). Data plotted in red is the interferometry data from the 1800 MHz antenna (initial slope=25.2±2% mK/min). Data plotted in blue is the SAR limit temperature for 1 g of tissue (slope=22.8 mK/min).

The probe beam experiences an optical path-length change caused by the thermal variation of the refractive index of the phantom liquid. Therefore the phase difference, as well as temperature rise versus time (from "RF on"), is plotted for 900 MHZ and 1800 MHz antenna fed by 325 mW (resonantly tuned to phantom load). For comparison, the same graph shows a temperature rise that corresponds to the currently specified maximum specific absorption rate (SAR) averaged over 1 g of tissue. This illustrates that for the 900 MHz antenna there is a linear temperature rise of 15.8±1% mK/min within the first minute of exposure. For the 1800 MHz antenna the initial response is faster, a linear temperature rise of 25.2±2% mK/min, occurs in the first 30 seconds.

Figure 14:
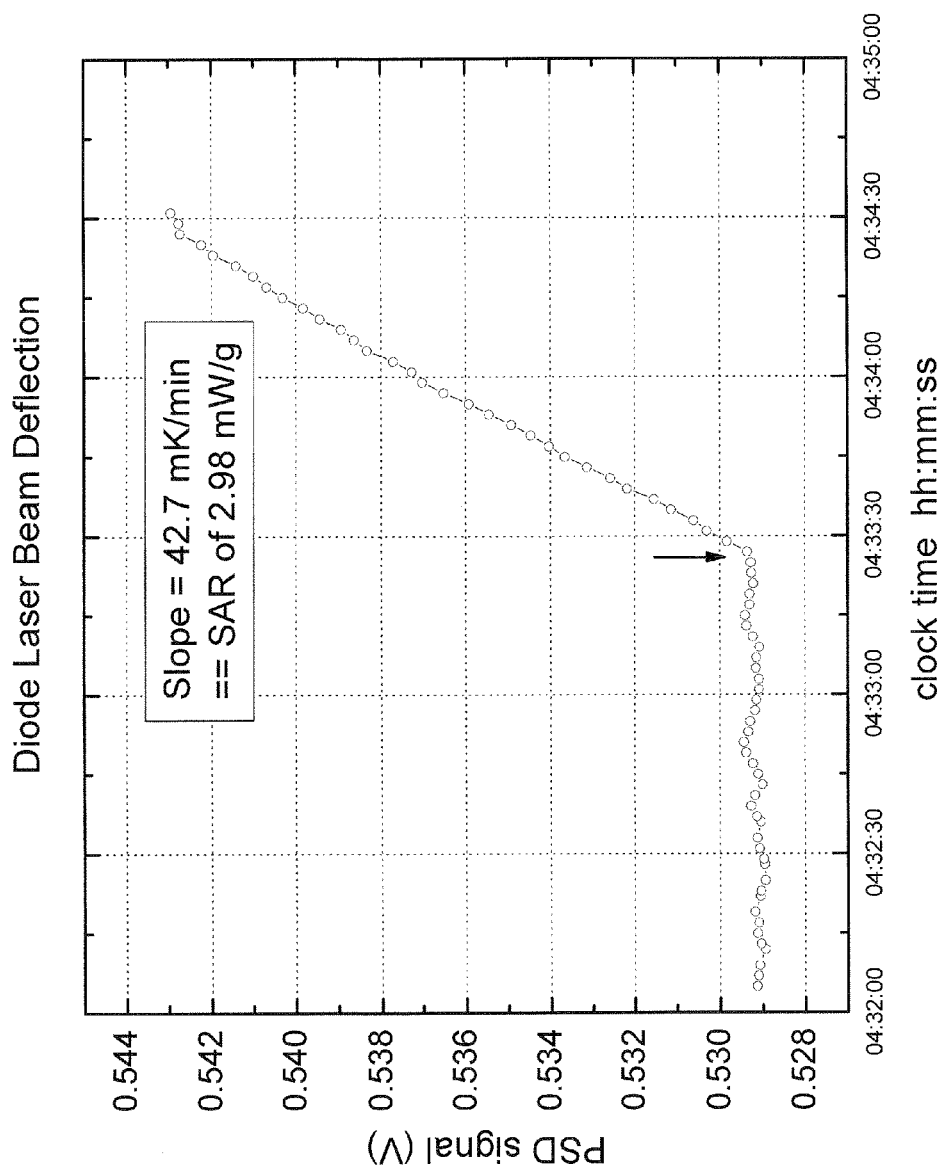
FIG. 14 shows the results of a beam deflection test similar to that described in the context of FIG. 7, for example with an 1800 MHz antenna with a power of 10 mW.

FIG. 14 shows the results of a similar test to that described in the context of FIG. 7, which shows the onset of beam deflection on one position sensitive detector after power to the antenna is turned on. The SAR measurements shown are average values for the particular beam path through the phantom.

Figure 15:
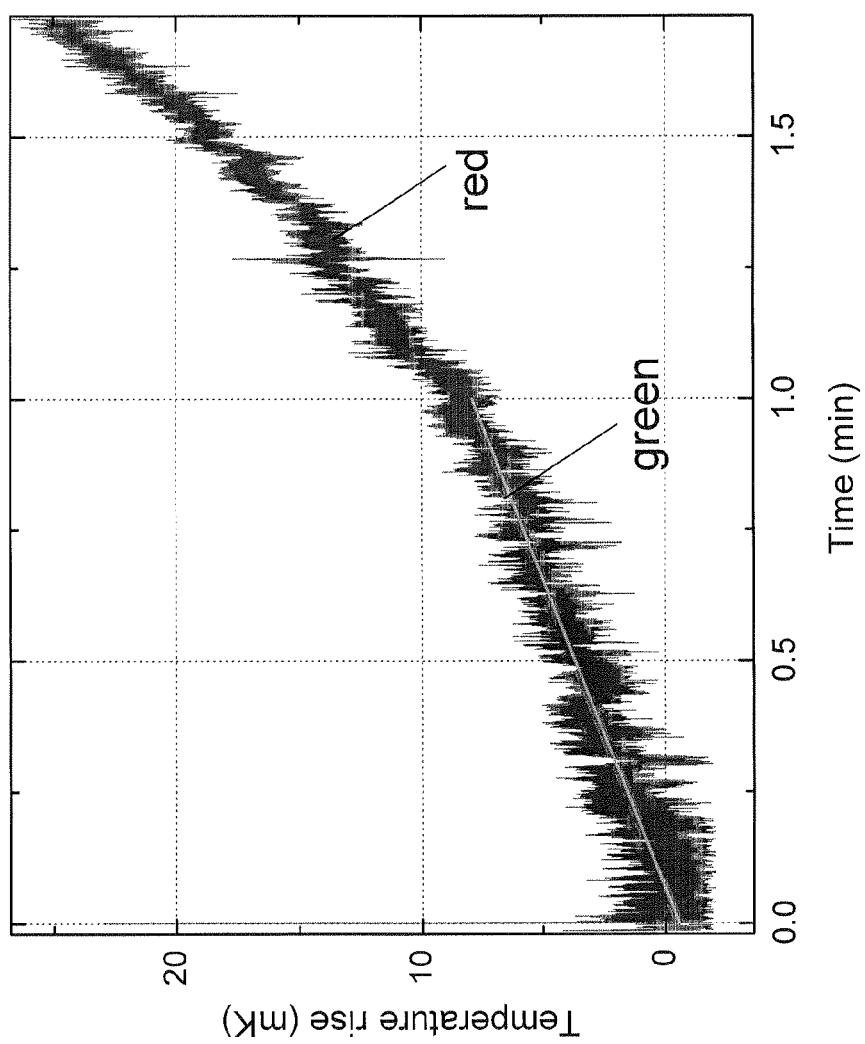
FIG. 15 shows temperature derived from interferometer data acquired according to the setup in FIG. 1 as a function of time since exposure to RF signal from a Nokia 6310i mobile telephone set at its maximum power at 900 MHz.
Figure 16:
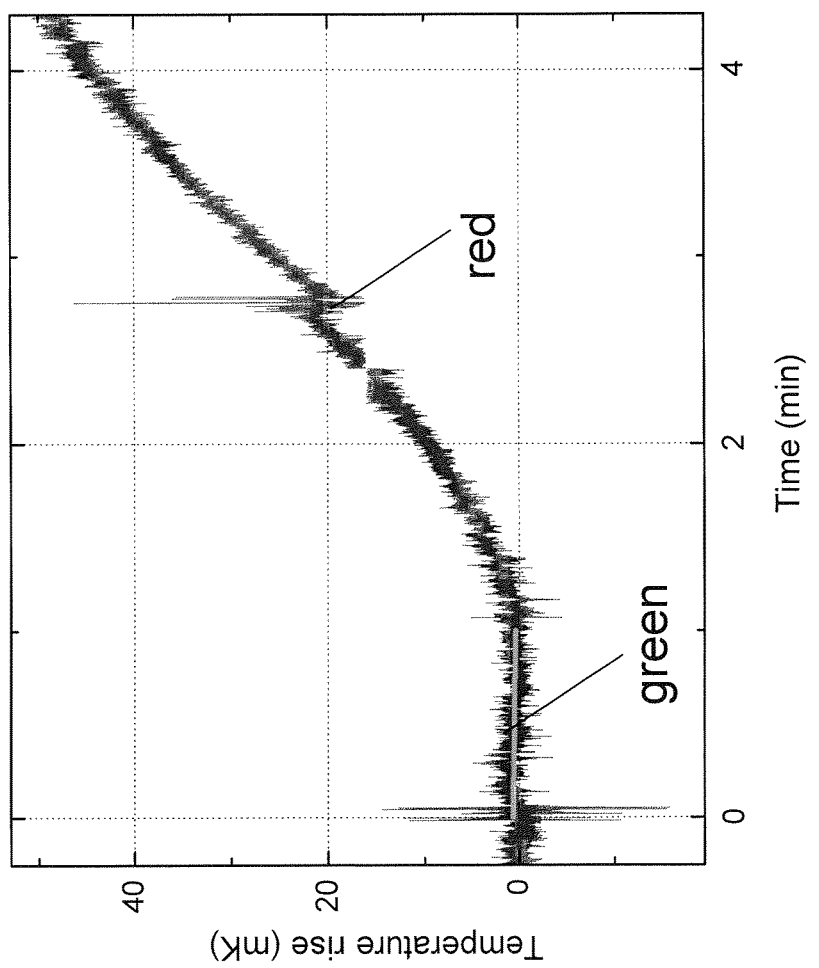
FIG. 16 shows a similar test to that performed in FIG. 15, but with the telephone switched OFF in order to show only the thermal "signature" of the telephone which comes with a delay of more than 60 seconds.

FIGS. 15 and 16 show now the deflection measurements of SAR can distinguish between RF heating and thermal conduction effects form the wireless device placed near the phantom. FIG. 16 shows the two phases of heating. The first slope results from RF heating but after a time delay the effect of thermal conduction from the wireless device kicks in and the slope changes. FIG. 16 shows the effect of thermal conduction alone. There is no initial heating until a characteristic time has elapsed and then heat begins to be conducted to the measurement region and beam deflection occurs.

Two mobile telephones (Motorola V290 made by Motorola, Inc. of Schaumburg, Ill., United States and Nokia 6310i made by the Nokia Corporation of Tampere, Finland) were also tested using our laboratory version of the rapid SAR assessment system (FIGS. 1-9). When performing the test on certain mobile or cellular telephones, the surface temperature (a reflection of both the heat given off by the operating electronics as well as telephone contact with the user, among other things) and the total heat energy stored in the mobile telephone can be transferred to the phantom. In this situation, microwave transparent thermal insulation can be used to limit or prevent this effect to improve the quality of data obtained. In the experiments presented herein, it is shown that insulating the telephone from the interior tank of the phantom can lead to a delay of thermal conduction from the telephone to the tank by at least 2 minutes.

FIG. 15 shows temperature derived from interferometer data acquired according to the setup in FIG. 1 as a function of time since exposure to RF signal from a Nokia 6310i mobile telephone set at its maximum power at 900 MHz. The output power and frequency of the Nokia 6310i mobile telephone were controlled using a base station simulator or remote control terminal. The telephone was commanded via the base station simulator to transmit at its highest output power level at 900 MHz. The Nokia 6310i mobile telephone was tested in the "cheek" position on a thermally insulating pad placed on the inner lid of the phantom. In this position, the vertical center line of the body of the mobile telephone was parallel to and directly above the laser beam. The probe laser beam was placed approximately ~3 mm into phantom liquid. The red curve represents telephone temperature derived from the interferometry measurement, while the green line is a linear fit of the first minute of that data. The initial slope of the fit was 8.32±0.01 mK/min. Note: noticeable glitches in the interferometry data at 0 seconds correspond to opening the lid and placing the Nokia 6310i mobile telephone on the phantom.

FIG. 16 shows a similar test to that performed in FIG. 15, but with the telephone switched OFF in order to show only the thermal "signature" of the telephone. The probe laser beam was directly below interface of phantom liquid (~3 mm into phantom liquid). The telephone was set at its minimum power at 900 MHz. The telephone was on its backside, parallel to the probe beam, and resting on the thermal pad ~7 mm from the interface of phantom liquid. The data plotted in red in FIG. 16 corresponds to temperature derived from raw interferometry data. The data plotted in green corresponds to a linear fit of the initial 60 seconds of interferometry data. The initial slope of the fit was −0.27±0.01 mK/min. The visible glitches in the interferometry data at 0 seconds correspond to opening the lid and putting the cellular telephone on the phantom. The glitch at 2.75 minutes corresponds to removing the telephone and shows that the insulation pad continues to heat the phantom.

The interferometer tests of the Nokia 6310i mobile telephone in FIGS. 15 and 16 were done with the telephone on its back on the thermal pad.

This is the position in which the telephone can transfer the most heat to the phantom (i.e., a thermally "less favorable position"). Therefore, the measurement provides an illustration of how the method performs under non-optimized conditions. Even so, as shown in FIG. 16, there is least one minute before the system 10 begins to detect any heat directly transferred by the telephone to the phantom, and the telephone begins to transfer heat to the phantom as a hot object. The data in FIGS. 15 and 16, taken together, clearly demonstrate a lag time before thermally conducted heat is detected.

Figure 17:
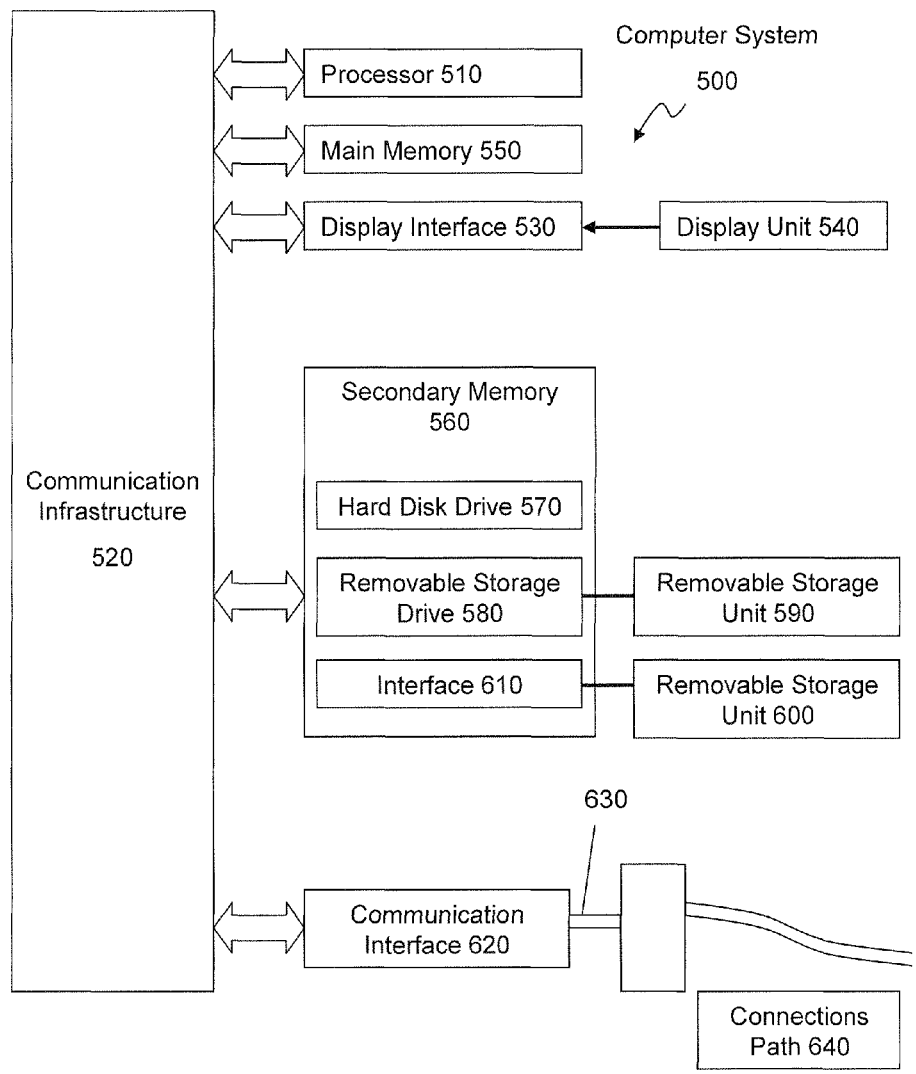
FIG. 17 shows an exemplary computer system that may be used in conjunction with aspects of the present invention.

Aspects of the present invention may be implemented using hardware, software or a combination thereof and may be implemented in one or more computer systems or other processing systems. In one variation, aspects of the present invention are directed toward one or more computer systems capable of carrying out the functionality described herein. An example of such a computer system 500 is shown in FIG. 17.

Computer system 500 includes one or more processors, such as processor 510. The processor 510 is connected to a communication infrastructure 520 (e.g., a communications bus, cross-over bar, or network). Various software aspects are described in terms of this exemplary computer system. After reading this description, it will become apparent to a person skilled in the relevant art(s) how to implement aspects of the present invention using other computer systems and/or architectures.

Computer system 500 can include a display interface 530 that forwards graphics, text, and other data from the communication infrastructure 520 (or from a frame buffer not shown) for display on the display unit 540. Computer system 500 also includes a main memory 550, preferably random access memory (RAM), and may also include a secondary memory 560. The secondary memory 560 may include, for example, a hard disk drive 570 and/or a removable storage drive 580, representing a floppy disk drive, a magnetic tape drive, an optical disk drive, etc. The removable storage drive 580 reads from and/or writes to a removable storage unit 590 in a well-known manner. Removable storage unit 590 represents a floppy disk, magnetic tape, optical disk, etc., which is read by and written to removable storage drive 580. As will be appreciated, the removable storage unit 590 includes a computer usable storage medium having stored therein computer software and/or data.

In alternative variations, secondary memory 560 may include other similar devices for allowing computer programs or other instructions to be loaded into computer system 500. Such devices may include, for example, a removable storage unit 600 and an interface 610. Examples of such may include a program cartridge and cartridge interface (such as that found in video game devices), a removable memory chip (such as an erasable programmable read only memory (EPROM), or programmable read only memory (PROM) and associated socket, and other removable storage units and interfaces; which allow software and data to be transferred from the removable storage unit 600 to computer system 500.

Computer system 500 may also include a communications interface 620. Communications interface 620 allows software and data to be transferred between computer system 500 and external devices. Examples of communications interface 620 may include a modem, a network interface (such as an Ethernet card), a communications port, a Personal Computer Memory Card International Association (PCMCIA) slot and card, etc. Software and data transferred via communications interface 524 may be in the fouls of signals 630 which may be electronic, electromagnetic, optical or other signals capable of being received by communications interface 620. These signals 630 are provided to communications interface 620 via a connections path (e.g., channel) 640. This path 640 carries signals 630 and may be implemented using wire or cable, fiber optics, a telephone line, a cellular link, a radio frequency (RF) link and/or other communications channels. In this document, the terms "computer program medium" and "computer usable medium" are used to refer generally to media such as a removable storage drive 580, a hard disk installed in hard disk drive 570, and signals 630. These computer program products provide software to the computer system 500. Aspects of the present invention are directed to such computer program products.

Computer programs (also referred to as computer control logic) are stored in main memory 550 and/or secondary memory 560. Computer programs may also be received via communications interface 620. Such computer programs, when executed, enable the computer system 500 to perform the features in accordance with aspects of the present invention, as discussed herein. In particular, the computer programs, when executed, enable the processor 510 to perform the features of certain aspects of the present invention. Accordingly, such computer programs represent controllers of the computer system 500.

In one variation where aspects of the present invention are implemented using software, the software may be stored in a computer program product and loaded into computer system 500 using removable storage drive 580 hard disk drive 570 or communications interface 620. The control logic (software), when executed by the processor 510, causes the processor 510 to perform the functions in accordance with aspects of the present invention, as described herein. In another variation, aspects of the present invention are implemented primarily in hardware using, for example, hardware components, such as application specific integrated circuits (ASICs). Implementation of the hardware state machine so as to performthe functions described herein will be apparent to persons skilled in the relevant art(s).

Although variations of the invention have been described with reference to examples with respect to a SAR measuring method for mobile phones, it is within the scope and spirit hereof to incorporate or use such aspects with any suitable device. Further, while aspects of the invention have been described with reference to a flat phantom, the invention may be used with any other suitable type of phantom. Thus, it should be understood that numerous and various modifications may be made without departing from the spirit hereof.

What is claimed is:

1. A rapid specific absorption rate measurement system, comprising:
   at least one laser emitting light in a light path;
   at least one phantom positioned such that at least a portion of the light path is within a portion of the at least one phantom, wherein the at least one phantom is sealed and has an external surface defining the at least one phantom;
   a holder for securably orienting an electromagnetic radiation emitting device such that the electromagnetic radiation emitting device emits electromagnetic radiation into the portion of the at least one phantom;
   a collector coupled to an analyzer for collecting and analyzing light from the light path; and
   a thermal insulation pad located between the electromagnetic radiation emitting device and the portion of the at least one phantom,
   wherein the at least one laser, the holder, the electromagnetic radiation emitting device, the collector, the analyzer, and the thermal insulation pad are positioned external to the external surface of the at least one phantom.

2. The rapid specific absorption rate measurement system of claim 1, wherein the electromagnetic radiation emitting device is a cellular telephone.

3. The rapid specific absorption rate measurement system of claim 1, wherein the collector includes an aperture, and wherein the analyzer includes a PIN photodiode and wherein the collector and analyzer are capable of collecting and analyzing an interference pattern.

4. The rapid specific absorption rate measurement system of claim 1, wherein the collector includes at least one Position Sensitive Detector that is capable of detecting the deflection of the light from the at least one laser.

5. The rapid specific absorption rate measurement system of claim 1, wherein the at least one phantom has a rectilinear cross-sectional shape.

6. The rapid specific absorption rate measurement system of claim 1, wherein the at least one phantom has at least one side with an anthropomorphic shape.

7. The rapid specific absorption rate measurement system of claim 1, wherein the at least one phantom is at least partially filled with a liquid.

8. The rapid specific absorption rate measurement system of claim 7, wherein the liquid comprises a salt solution.

9. The rapid specific absorption rate measurement system of claim 1, wherein the at least one phantom is double-walled.

10. The rapid specific absorption rate measurement system of claim 1, wherein the at least one phantom is modular.

11. The rapid specific absorption rate measurement system of claim 1, further comprising at least one mirror positioned to reflect the light emitted by the at least one laser in the light path, wherein the at least one mirror is positioned external to the external surface of the at least one phantom.

12. The rapid specific absorption rate measurement system of claim 11, wherein the system includes two or more mirrors.

13. A rapid specific absorption rate measurement system, comprising:
   a first and second laser, each of the first and second lasers emitting light in a light path, the first and second lasers being oriented relative to one another such that the light path of first laser is approximately orthogonal to the light path of the second laser;
   at least one phantom positioned such that at least a portion of the light paths of the first and second lasers each fall within a portion of the at least one phantom, wherein the at least one phantom is sealed and has an external surface defining the at least one phantom;
   a holder for securably orienting an electromagnetic radiation emitting device such that the electromagnetic radiation emitting device emits electromagnetic radiation into the portion of the at least one phantom;
   a collector, including at least one Position Sensitive Detector that is capable of detecting a deflection of light along the light paths of the first and second lasers; and
   a thermal insulation pad located between the electromagnetic radiation emitting device and the portion of the at least one phantom,
   wherein the first and second laser, the holder, the electromagnetic radiation emitting device, the collector, and the thermal insulation pad are positioned external to the external surface of the at least one phantom.

14. The rapid specific absorption rate measurement system of claim 13, wherein the electromagnetic radiation emitting device is a cellular telephone.

15. The rapid specific absorption rate measurement system of claim 13, wherein the system further includes a third and fourth laser.

16. The rapid specific absorption rate measurement system of claim 13, wherein the system includes an analyzer for reconstructing a three dimensional specific absorption rate profile of the electromagnetic radiation emitting device from data obtained by the position sensitive detector.

17. The rapid specific absorption rate measurement system of claim 16, wherein the three dimensional specific absorption rate profile is produced in about a minute or less.

18. The rapid specific absorption rate measurement system of claim 13, wherein the at least one phantom has a rectilinear shape.

19. The rapid specific absorption rate measurement system of claim 13, wherein the at least one phantom has at least one side with an anthropomorphic shape.

20. The rapid specific absorption rate measurement system of claim 19, wherein the at least one phantom is at least partially filled with a liquid.

21. The rapid specific absorption rate measurement system of claim 20, wherein the liquid is a salt solution.

22. The rapid specific absorption rate measurement system of claim 13, wherein the at least one phantom is double-walled.

23. A method using a rapid specific absorption rate measurement system to measure a specific absorption rate profile of an electromagnetic radiation emitting device, the method comprising:
   positioning an electromagnetic radiation emitting device such that the electromagnetic radiation emitting device emits electromagnetic radiation through a thermal insulation pad and into a portion of a phantom, wherein the phantom is sealed and has an external surface defining the phantom, and wherein the thermal insulation pad is located between the electromagnetic radiation emitting device and the portion of the phantom;
   projecting laser light emitted by a laser through the portion of the phantom;

collecting, at a collector, the laser light that is projected through the portion of the phantom; and analyzing the light that is projected through the portion of the phantom at an analyzer to determine the specific absorption rate profile of the electromagnetic radiation emitting device, wherein the electromagnetic radiation emitting device, the laser, the collector, the analyzer, and the thermal insulation pad are positioned external to the external surface of the phantom.

24. The method of claim 23, wherein collecting the light includes:

collecting an interference pattern; and analyzing the light includes:

analyzing the interference pattern.

25. The method of claim 23, wherein collecting the light includes:

measuring the deflection of the light as the light passes through the phantom; and analyzing the light includes:

analyzing the deflection of the light as the light passes through the phantom.

26. The method of claim 25, wherein:

collecting the light includes:

collecting the light from four or more lasers; and analyzing the light includes:

analyzing the light from the four or more lasers.

27. The method of claim 25, wherein analyzing the light includes:

reconstructing a three dimensional specific absorption rate profile of the electromagnetic radiation emitting device from data relating to the deflection of the light as the light passes through the phantom.

28. The method of claim 27, wherein the three dimensional specific absorption rate profile is produced in a minute or less.

29. The method of claim 25, wherein the phantom is modular.

30. The method of claim 25, wherein the phantom has a rectilinear shape.

31. The method of claim 25, wherein the phantom has at least one side with an anthropomorphic shape.

* * * * *